United States Patent
Park et al.

(10) Patent No.: US 7,145,195 B2
(45) Date of Patent: Dec. 5, 2006

(54) SEMICONDUCTOR MEMORY DEVICE AND METHOD OF MANUFACTURING THE SAME

(75) Inventors: Je-Min Park, Kyungki-do (KR); Yoo-Sang Hwang, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 198 days.

(21) Appl. No.: 10/803,592

(22) Filed: Mar. 17, 2004

(65) Prior Publication Data
US 2004/0183113 A1    Sep. 23, 2004

(30) Foreign Application Priority Data
Mar. 18, 2003    (KR)    ............. 10-2003-0016812

(51) Int. Cl.
*H01L 27/108*    (2006.01)
(52) U.S. Cl. .......... 257/296; 257/297; 257/298; 257/300
(58) Field of Classification Search ........... 257/296, 257/297, 298, 300
See application file for complete search history.

(56) References Cited

FOREIGN PATENT DOCUMENTS
KR    2002-0066138    8/2002

OTHER PUBLICATIONS
English language abstract of Korean Publication No. 2002-0066138.

*Primary Examiner*—Doug Menz
(74) *Attorney, Agent, or Firm*—Marger Johnson & McCollom, P.C.

(57) ABSTRACT

A semiconductor device comprises a semiconductor substrate including an isolation region defining an active area with a plurality of source/drain regions. A contact pad layer is formed on the semiconductor substrate and includes gate line structures, first contact pads connected to parts of the source/drain regions, second contact pads connected to the other source/drain regions. A first interlevel dielectric layer covers the gate line structures and the first and second contact pads. A bit line contact plug layer is formed on the contact pad layer and includes lower storage node contact plugs connected to the first contact pads, bit line contact plugs connected to the second contact pads. A protective layer pattern is formed on the second contact pads to prevent the second contact pads from being connected to the lower storage node contact plugs and/or upper storage node contact plugs.

10 Claims, 25 Drawing Sheets

SEMICONDUCTOR MEMORY DEVICE AND METHOD OF MANUFACTURING THE SAME

This application claims the priority of Korean Patent Application No. 2003-16812, filed on Mar. 18, 2003, in the Korean Intellectual Property Office, the disclosure of which is incorporated herein in its entirety by reference.

BACKGROUND OF THE INVENTION

1. Field of the Invention

The present invention relates to semiconductor devices and methods of manufacturing the same and, more particularly, to a semiconductor memory device and to a method of manufacturing the same.

2. Description of the Related Art

The design rules of semiconductor memory devices have been continuously reduced. As design rules become smaller, the area of each unit memory cell becomes smaller. In particular, when an area of a memory cell is reduced, the critical length (CD) of the bottom of a capacitor is also reduced. A reduction in the CD of the capacitor bottom creates a need to fabricate a COB cell structured semiconductor that has sufficiently large capacitance and which does not fall down.

Many capacitors structures have been proposed to increase the capacitance of a capacitor. Among the proposed structures is a capacitor with a cylindrical lower electrode. Such a structure has been widely used because both its inner and outer surfaces can be used as effective areas. However, as design rules decrease, the CD of a cylindrical capacitor decreases and its height increases.

FIG. 1 illustrates, as an example, the equivalent circuit of a semiconductor dynamic random access memory (DRAM). Referring to FIG. 1, 2-bit memory cells share a bit line BL. Gate electrodes G of adjacent transistors are connected with each other via a word line WL. The WL can also be called a gate line. Each memory cell is comprised of a transistor and a capacitor C. Here, the gate and source/drain of the transistor are indicated with G and S/D, respectively.

FIGS. 2A through 5D show a conventional semiconductor memory device that can be represented by the equivalent circuit of the memory cell shown in FIG. 1 and these figures also show a method of fabricating such a circuit. In detail, FIGS. 2A, 3A, 4A, and 5A are plan views of the semiconductor memory device and the other drawings are cross-sectional views thereof. In the plan views, some elements, such as an interlevel dielectric layer, are omitted. Also, the elements newly formed in each process step are illustrated with hatched lines to be distinguished from the existing elements.

Referring to FIGS. 2A through 2D, an isolation region 104 is defined in a semiconductor substrate 100 using conventional device isolation techniques, e.g., trench isolation. Those portions of the semiconductor substrate 100 isolated by the isolation region 104 are active areas 102. S/D denotes a portion of the active area 102, in which source/drain regions will be formed. FIGS. 2B, 2C, and 2D are cross-sectional views of the semiconductor memory device of FIG. 2A, taken along lines I–I', II–II', and III–III', respectively.

The memory cell of the semiconductor memory device shown in FIGS. 2A through 2D is characterized by S/D portions that are arranged a straight line in the length and width directions. The active area 102 is defined such that channels of the transistor are at right angles to a gate line. Such an arrangement is different from an arrangement in which the S/D portions are disposed in a zigzag pattern or in which the channel regions of transistor are disposed in an oblique line with respect to a gate line. The arrangement of the S/D portions and the transistor channels, shown in FIGS. 2A through 2D, is frequently adopted because they help increase the integration of a semiconductor memory device and they help the electric characteristics of the transistors.

FIG. 3A is a plan view of a structure including gate line structures 112, first contact pads 114, and second contact pads 116. FIGS. 3B through 3D are cross-sectional views of the structure of FIG. 3, taken along lines I–I', II–II', and III–III', respectively.

First, the gate line structures 112 are formed on the semiconductor substrate 100. The gate line structure 112 may include a gate dielectric layer formed of a material such as oxide, a conductive layer, a hard mask layer, and a sidewall spacer. During and/or after manufacture of the gate line structure 112, source/drain regions 105 and 106 may be formed in the active areas 102 using ion implantation. Next, a first interlevel dielectric layer 118 is deposited and planarized, and then, first contact holes (not shown) are formed. The first contact holes may be formed using a self aligned contact (SAC) method. Next, the first contact holes are filled with a conductive material and the conductive material is planarized so as to form the first and second contact pads 114 and 116. The first contact pads 114 are connected to the source/drain regions 105 and the second contact pads 116 are connected to the source/drain regions 106.

Referring to FIG. 3B, the first contact pads 114 are disposed such that the distance between adjacent first contact pads 114 is relatively large, e.g., about 1.5 pitch, in the width direction, i.e., perpendicularly to the gate line structure 112. A second contact pad 116 is positioned between adjacent first contact pads 114. Referring to FIG. 3C, the distance between adjacent first contact pads 141 is 0.5 pitches in the length direction, i.e., parallel to the gate line structure 112. That is, the first contact pads 114 are more densely arranged in the length direction than in the width direction.

FIG. 4A is a plan view of a structure stacked with bit line contact plugs 126, bit line structures 132, and storage node contact plugs 136. FIGS. 4B through 4D are cross-sectional view of the structure of FIG. 4A, taken along lines I–I', II–II', and III–III', respectively.

First, the structure of FIG. 4A is made by depositing a second interlevel dielectric layer 122 on the first interlevel dielectric layer 118 covering the first and second contact pads 114 and 116. The deposited second interlevel dielectric layer 122 is planarized. Next, the second interlevel dielectric layer 122 is patterned to form second contact holes (not shown) in a region in which bit line contact plugs 126 will be formed. The second contact pads 116 are exposed through the second contact holes. Thereafter, the second contact holes are filled with a conductive material to form the bit line contact plugs 126.

Next, the bit line structures 132 are formed on the bit line contact plugs 126 so that the bit line structures 132 are connected to the bit line contact plugs 126. The bit line structures 132 are perpendicular to the gate line structures 112. In general, a lower cross-section of the bit line structure 132 is covered with a conductive layer, i.e., the lower conductive layer, and its upper cross-section is covered with a hard mask layer. The lower conductive layer may be formed by patterning the conductive material on the second interlevel dielectric layer 122 during manufacture of the bit line structures 132. In general, the hard mark layer is formed of an insulating material with a high etching selectivity against the second interlevel dielectric layer 122 and a third interlevel dielectric layer 134.

Next, the third interlevel dielectric layer 134 is deposited on the second interlevel dielectric layer 122 and the bit line structures 132 and then is planarized. Then, the second and third interlevel dielectric layers 122 and 134 are patterned to form third contact holes (not shown). Through the third contact holes, the first contact pads 114 are exposed. Like the first contact pads 114, the third contact holes are arranged straight to prevent the second contact pads 116 from being exposed through the third contact holes in the second and third interlevel dielectric layer 122 and 134.

Thereafter, the third contact holes are filled with a conductive material and node separation is performed thereon so as to obtain the storage node contact plugs 136. As a result, as shown in FIG. 4A, the storage node contact plugs 136 are formed in a straight line in the length and width directions, the storage node contact plugs 135 being arranged more densely in the width direction than in the length direction.

For simplicity, the storage node contact plug 136 covered with the second interlevel dielectric layer 122 is hereinafter referred to as a lower storage node contact plug 136a and the storage node contact plug 136 covered with the third interlevel dielectric layer 134 is hereinafter referred to as an upper storage node contact plug 136b.

FIG. 5A shows a plan arrangement view of capacitor lower electrodes 142. FIGS. 5B through 5D are cross-sectional views of the structure of FIG. 5A, taken along lines I–I', II–II', and III–III', respectively.

A method of fabricating the capacitor lower electrodes 142, shown in FIG. 5A, of a cylindrical capacitor will now be described. First, an etch stopper (not shown) and a mold insulating layer (not shown) are sequentially formed on the resultant structure. Next, the mold insulating layer is etched using a photolithographic process and the exposed etch stopper is removed so as to define an area in which the capacitor lower electrodes 142 are to be formed. Next, a conductive layer (not shown) is conformably deposited on the resultant structure using a material for the capacitor lower electrodes 142, e.g., a polysilicon material or a metal material. Then, a buffer insulating layer (not shown) is deposited on the conductive layer. Next, the buffer insulating layer is etched through dry etch back or chemical mechanical polishing (CMP) and nodes of the conductive layer are separated from each other so as to form the capacitor lower electrodes 142. Next, the remaining buffer insulating layer and mold-insulating layer are removed to obtain the cylindrical capacitor lower electrodes 142.

As described above, conventionally, the storage node contact plugs 136 are arranged densely in a straight line in the length direction. Therefore, the capacitor lower electrodes 142 connected to the storage node contact plugs 136 are also arranged densely and in a straight line in the length direction. The capacitor lower electrode 142 has either a rectangular shape whose length and width are substantially different from each other, or an oval shape, the lengths of whose long axis and short axis are substantially different from each other (see FIG. 5A).

If the capacitor lower electrodes 142 are rectangular (or oval) and cylinder shaped and there is, in the case of a DRAM, a design rule of 0.10 μm, the length of the rectangular cylinder (or the length of the long axis of the oval cylinder) is about 300 nm, its width (or the length of the short axis of the oval cylinder) is about 120 nm, and its height is about 1500 nm. That is, the ratio of the height of the capacitor lower electrode 142 to its length is about 1:5. However, the ratio of the height to the width is 1:12 or more. Also, the distance between adjacent capacitor lower electrodes 142 is just 80 nm in the length direction.

As the height of the capacitor lower electrode 142 increases, it is more likely that the capacitor lower electrode 142 will fall down in the length direction. Also, since the distance between adjacent capacitor lower electrodes 142 in the length direction is very small, it is more likely that adjacent capacitor lower electrodes 142 will connect to each other and that the connection causes a 2-bit failure. This may occur even when one of the capacitor lower electrodes 142 is inclined to a small degree in the length direction.

Further, when the design rule of a semiconductor memory device is 0.10 μm or less, the distance between the third contact hole(s) and/or the capacitor lower electrode(s) 142 is small, and therefore, ArF equipment and an ArF photo resist are required during a photolithographic process. However, the use of the ArF equipment and ArF photo resist increases manufacturing costs and reduces a process margin.

SUMMARY OF THE INVENTION

According to one aspect of the present invention, a semiconductor memory device comprises a semiconductor substrate including an isolation region that defines an active area having a plurality of source/drain regions. The device has a contact pad layer formed on the semiconductor substrate. The contact pad layer includes gate line structures, first contact pads connected to parts of the source/drain regions, second contact pads connected to the other source/drain regions. The contact pad layer further includes a first interlevel dielectric layer covers the gate line structures and the first and second contact pads. A bit line contact plug layer is formed on the contact pad layer and includes a lower storage node contact plugs connected to the first contact pads. The device also includes bit line contact plugs connected to the second contact pads. The device further includes a protective layer pattern covering at least a portion of the second contact pads to prevent the second contact pads from connecting to the lower storage node contact plugs and/or upper storage node contact plugs. A second interlevel dielectric layer covers the lower storage node contact plugs and the protective layer pattern. A bit line layer is formed on the bit line contact plug layer and includes the upper storage node contact plugs connected to the lower storage node contact plugs and bit line structures connected to the bit line contact plugs. A third interlevel dielectric layer covers the upper storage node contact plugs and the bit line structures.

According to another aspect of the present invention, a semiconductor memory device includes a plurality of source/drain regions arranged in a substantially straight line in the length and width directions. The semiconductor memory device comprises a semiconductor substrate including an isolation region that defines an active area with the plurality of source/drain regions. A contact pad layer is formed on the semiconductor substrate and includes gate line structures, first contact pads connected to parts of the source/drain regions, second contact pads connected to the other source/drain regions. The contact pad layer further includes a first interlevel dielectric layer covering the gate line structures and the first and second contact pads. A bit line contact plug layer is formed on the bit line contact plug layer and includes lower storage node contact plugs connected to the first contact pads, bit line contact plugs connected to the first contact pads. A protective layer pattern prevents the second contact pads from being connected to the lower storage node contact plugs and/or upper storage node contact plugs. A second interlevel dielectric layer covers the lower storage node contact plugs and the protective layer pattern. A bit line layer is formed on the bit line contact plug layer and includes upper storage node contact plugs connected to the lower storage node contact plugs and arranged in a zigzag pattern, bit line structures connected to the bit line contact plugs. A third interlevel dielectric layer covers the upper storage node contact plugs and the bit line structures. Lower electrodes of the capacitor may be arranged in a zigzag pattern and be cylinder shaped.

According to yet another aspect of the present invention, a method comprises forming a contact pad layer on a semiconductor substrate in which an active area with a plurality of source/drain regions and an isolation region surrounding the active area are defined. The contact pad layer includes gate line structures, first contact pads connected to parts of the source/drain regions, second contact pads connected to the other source/drain regions, and a first interlevel dielectric layer formed to cover the gate line structures and the first and second contact pads. A protective layer pattern and a second interlevel dielectric layer are formed on the contact pad layer. The protective layer pattern protects the second contact pads from being connected to storage node contact plugs, which are to be formed in a subsequent process. The second interlevel dielectric layer covers the protective layer pattern. First contact holes are formed by patterning the second interlevel dielectric layer so as to expose the second contact pads. Bit line contact plugs are formed to fill the first contact holes. Bit line structures are connected to the bit line contact plugs. A third interlevel dielectric layer is formed to cover the bit line structures on the second interlevel dielectric layer. Second contact holes expose the first contact pads by patterning the second and third interlevel dielectric layers. The storage node contact plugs are formed to fill the second contact holes.

According to still another aspect of the present invention, a method comprises forming a contact pad layer on a semiconductor substrate in which an active area with a plurality of source/drain regions and an isolation region surrounding the active area are defined. The contact pad layer includes gate line structures, first contact pads connected to parts of the source/drain regions, second contact pads connected to the other source/drain regions, and a first interlevel dielectric layer covering the gate line structures and the first and second contact pads. A protective layer pattern and a second interlevel dielectric layer are formed on the contact pad layer. The protective layer pattern protects the second contact pads from being connected to storage node contact plugs, which will be formed in a subsequent process. A second interlevel dielectric layer is formed to cover the protective layer pattern. First contact holes are formed by patterning the second interlevel dielectric layer so as to expose the second contact pads. Bit line contact plugs are formed to fill the first contact holes. Bit line structures connect with the bit line contact plugs. A third interlevel dielectric layer covers the bit line structures on the second interlevel dielectric layer. Second contact holes expose the first contact pads by patterning the second and third interlevel dielectric layers. Storage node contact plugs are formed to fill the second contact holes.

During forming the second contact holes, the second and third interlevel dielectric layers may be patterned to form the second contact holes in a zigzag pattern.

The method may further include sequentially forming an etch stopper and a mold insulating layer on the resultant structure; defining an area for capacitor lower electrodes by patterning the etch stopper and the mold insulating layer to expose the storage node contact plugs; conformably forming a conductive layer for forming the capacitor lower electrodes on the area for the capacitor lower electrodes and the mold-insulating layer; forming a buffer insulating layer on the conductive layer; forming the capacitor lower electrodes by etching the buffer insulating layer and the conductive layer to separate nodes of the conductive layer from the resultant structure; removing the remaining buffer insulating layer and the mold-insulating layer; forming a dielectric layer on the capacitor lower electrodes; and forming capacitor upper electrodes on the dielectric layer.

The mold insulating layer and the etch stopper may be patterned to arrange the area for the capacitor lower electrodes in a zigzag pattern.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF THE PREFERRED EMBODIMENTS

Figure 1:
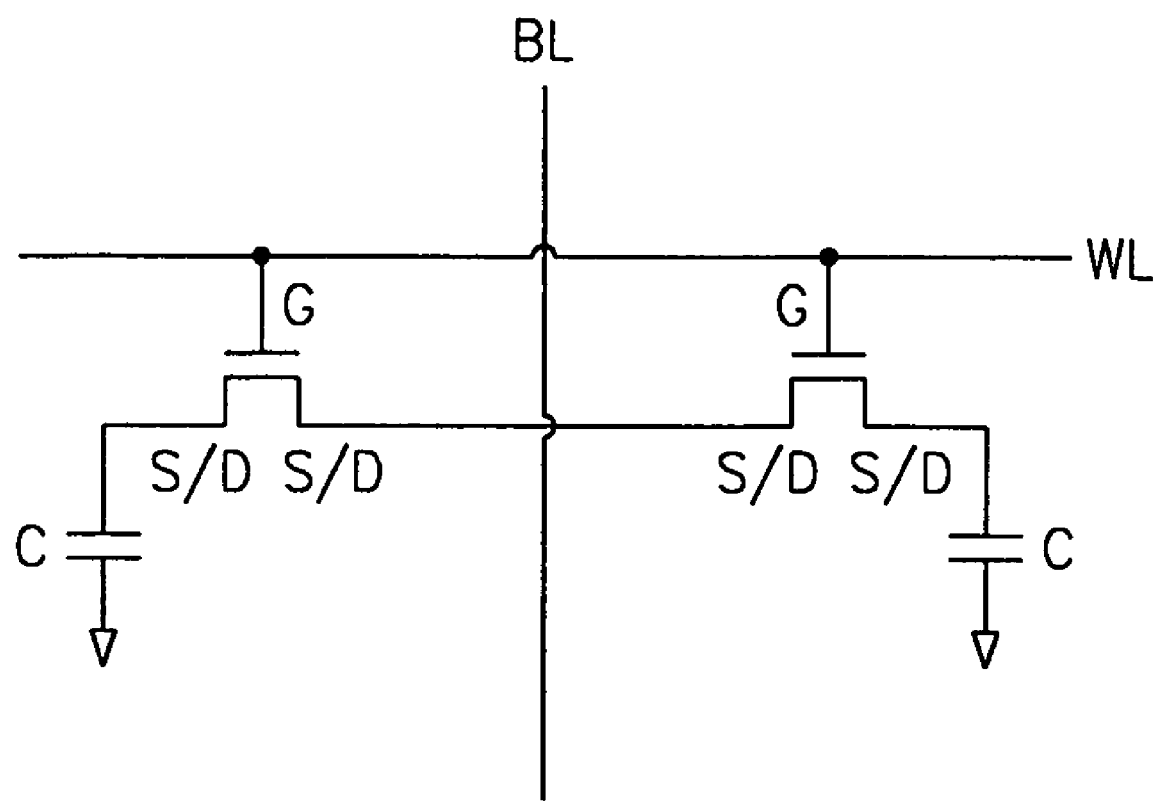
FIG. 1 is an equivalent circuit of each memory cell of a Dynamic Random Access Memory (DRAM) semiconductor device.
Figure 2A:
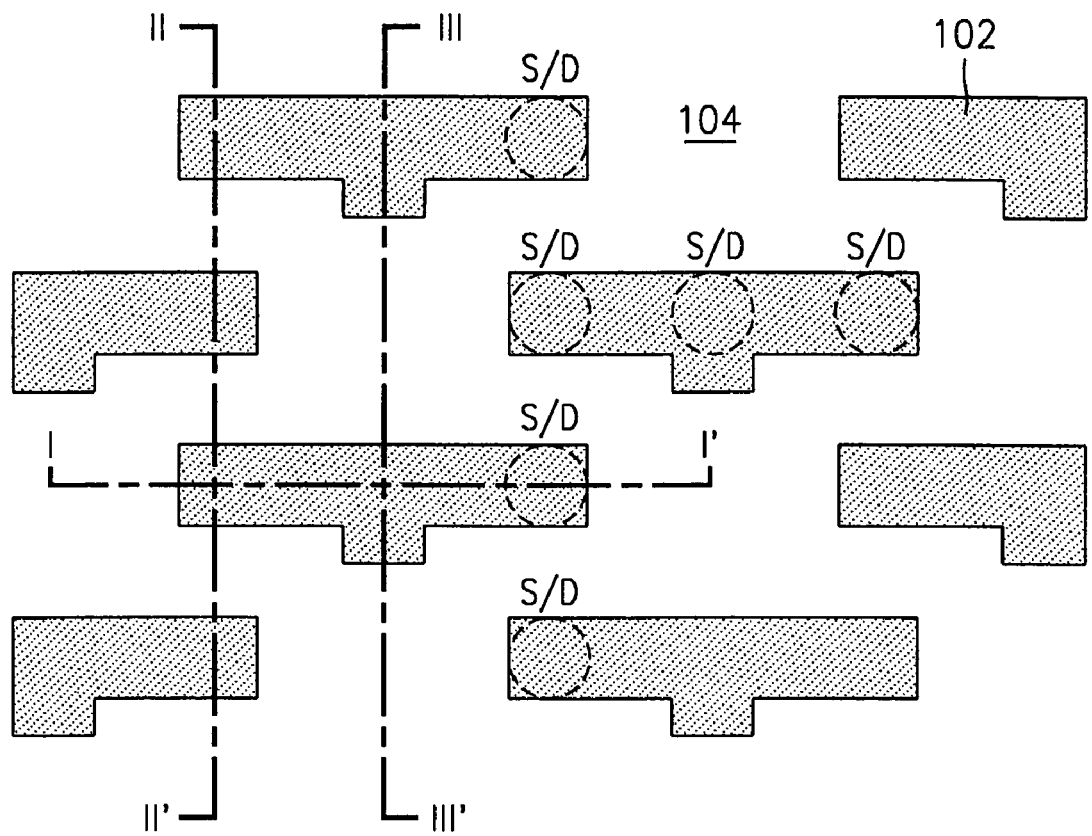
FIGS. 2A through 5D are plan views and cross-sectional views of a conventional semiconductor memory device and a method of manufacturing the same.
Figure 2B:
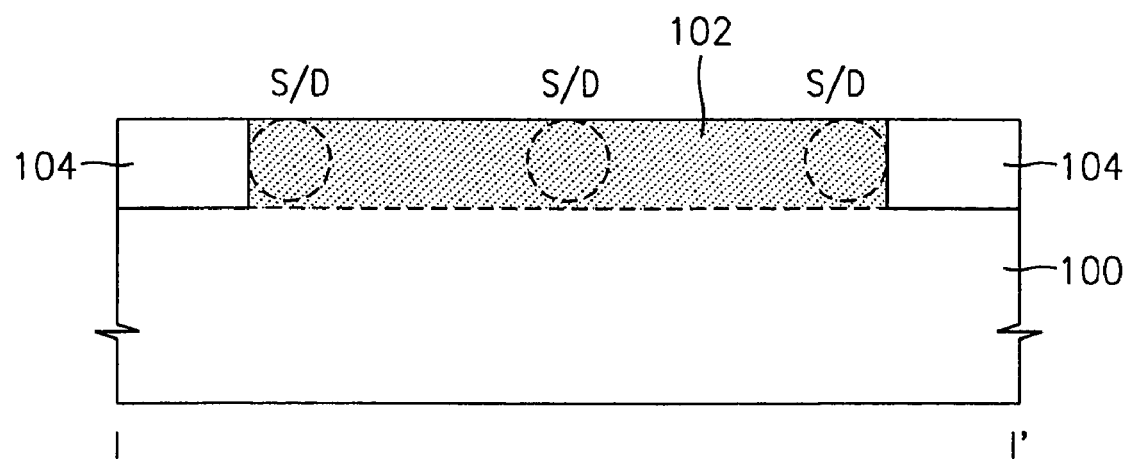
Figure 2C:
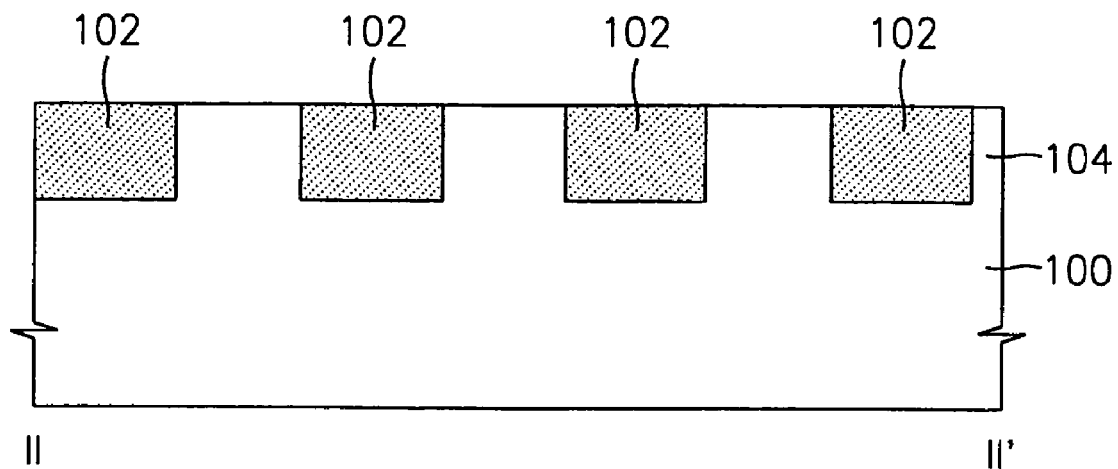
Figure 2D:
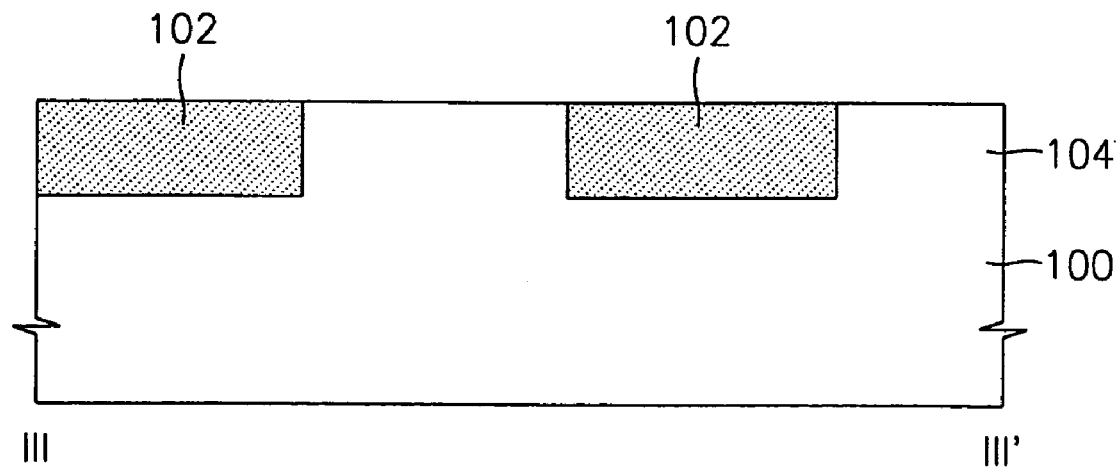
Figure 3A:
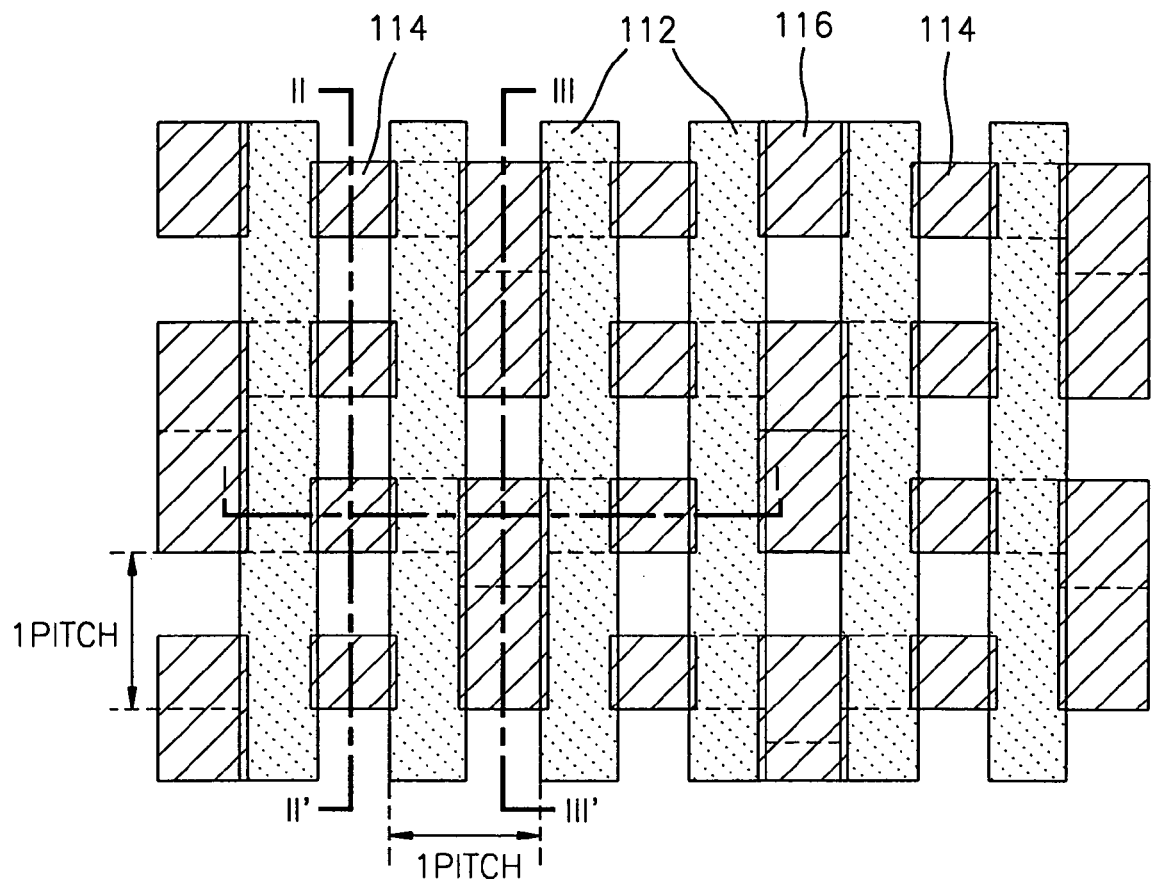
Figure 3B:
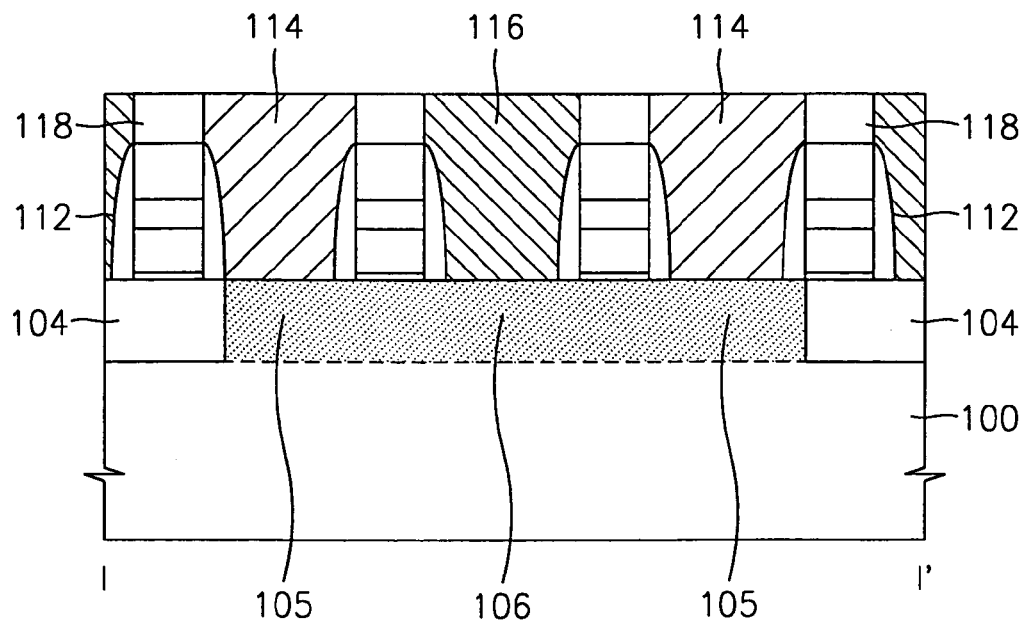
Figure 3C:
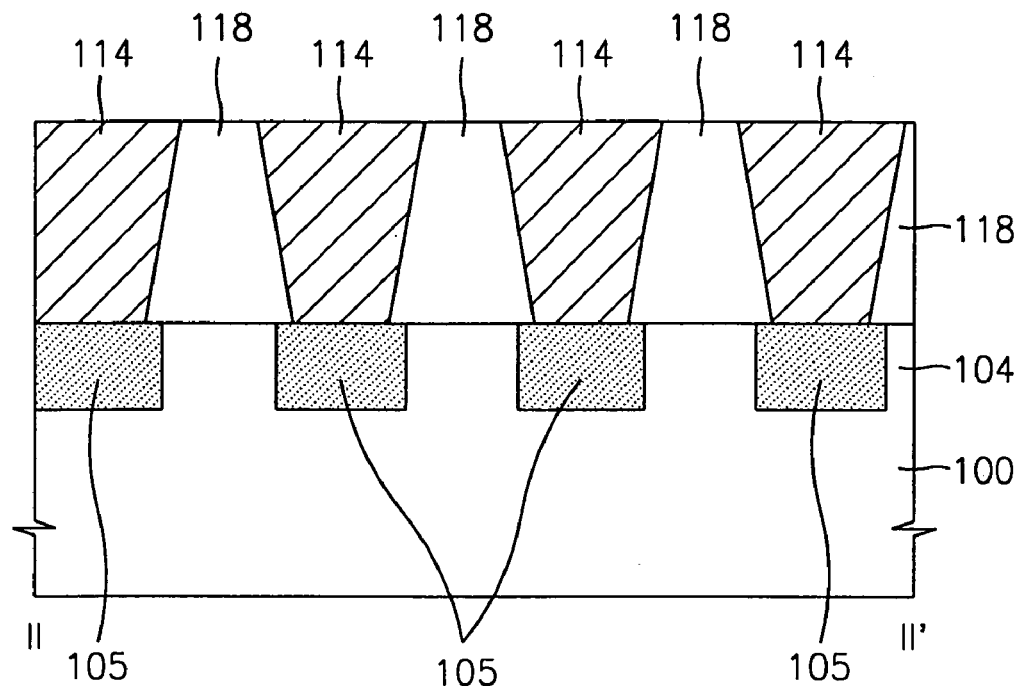
Figure 3D:
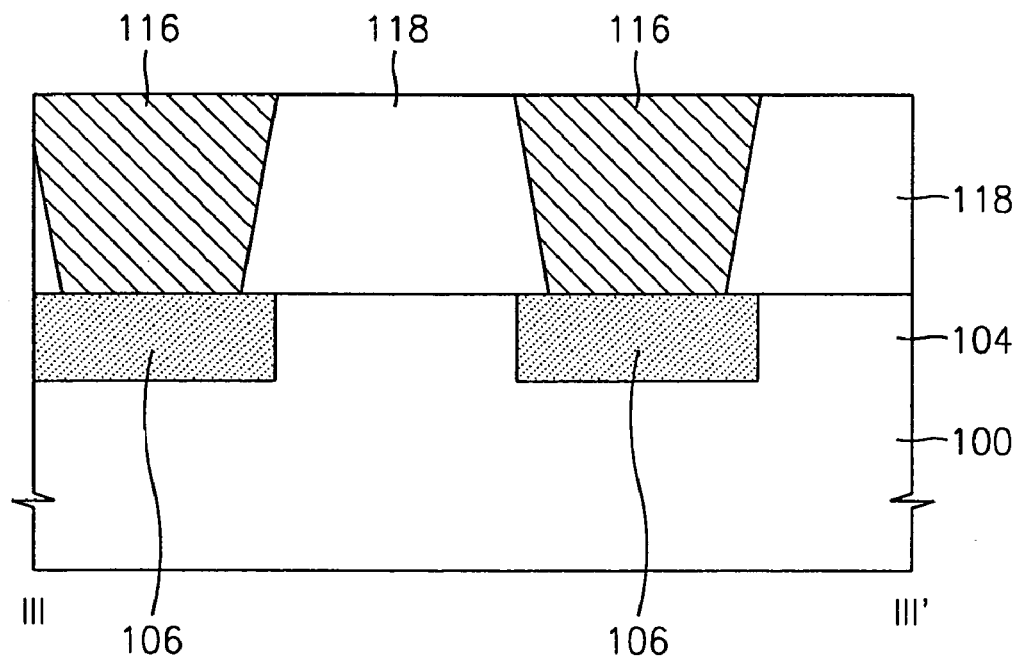
Figure 4A:
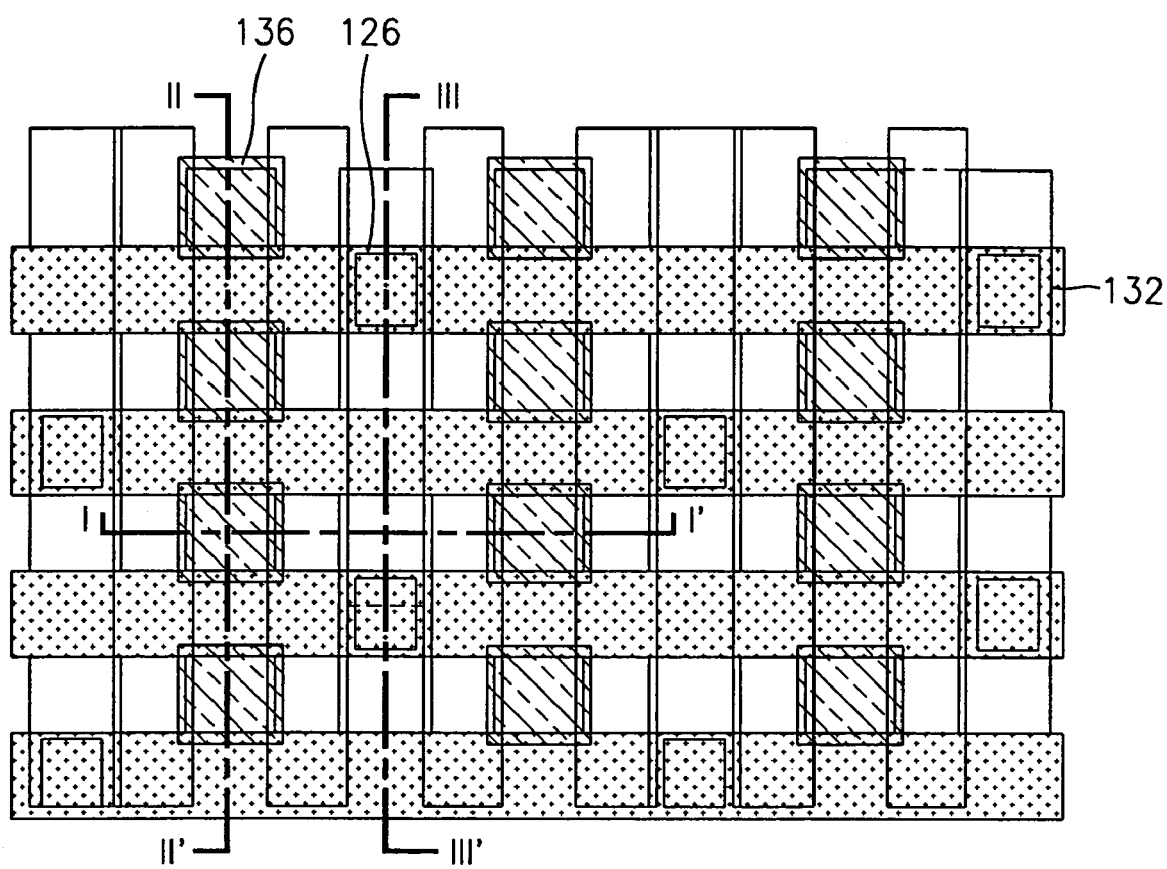
Figure 4B:
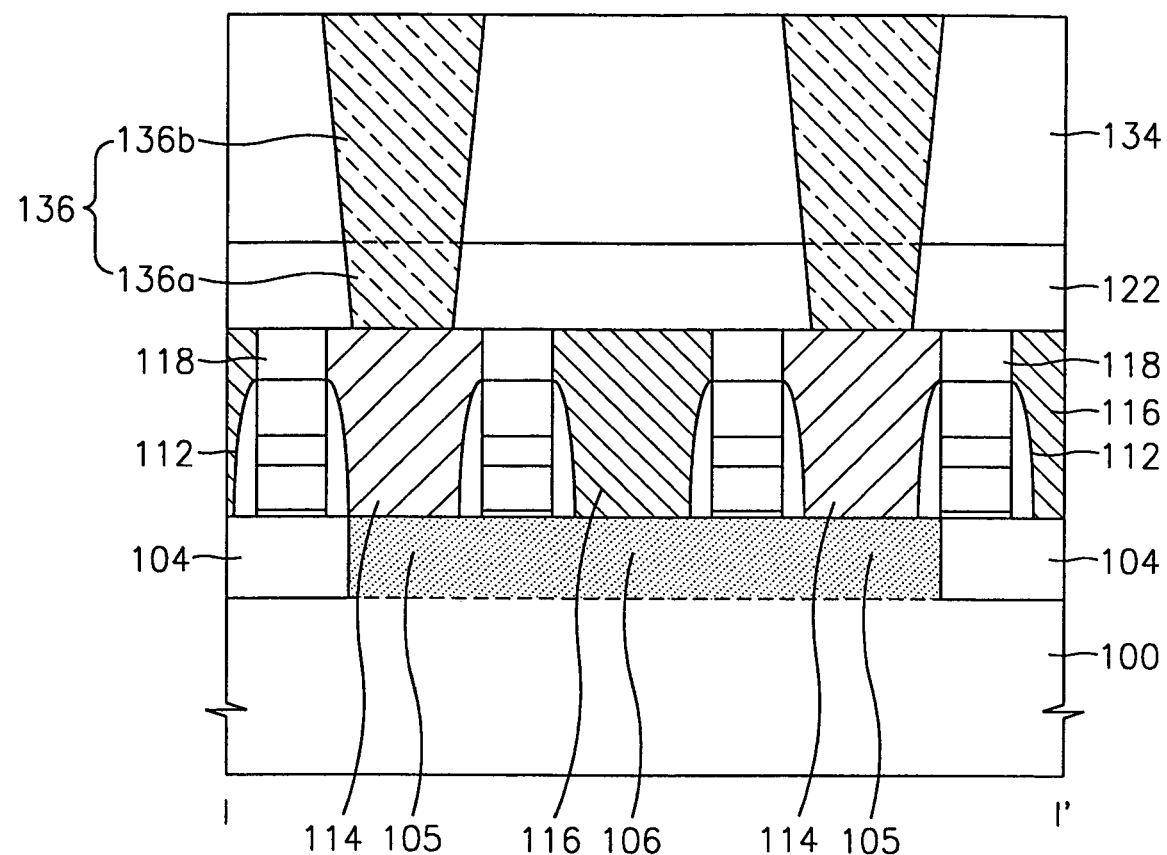
Figure 4C:
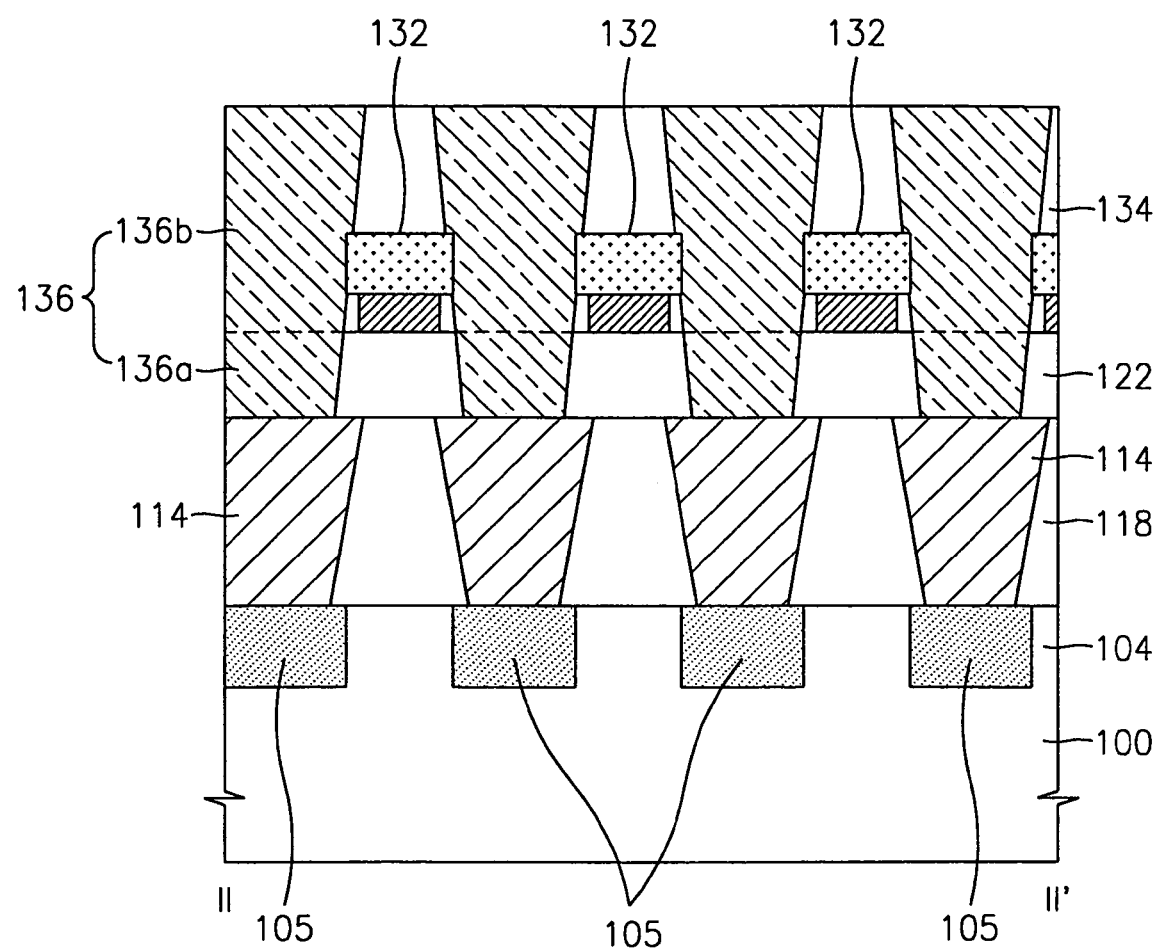
Figure 4D:
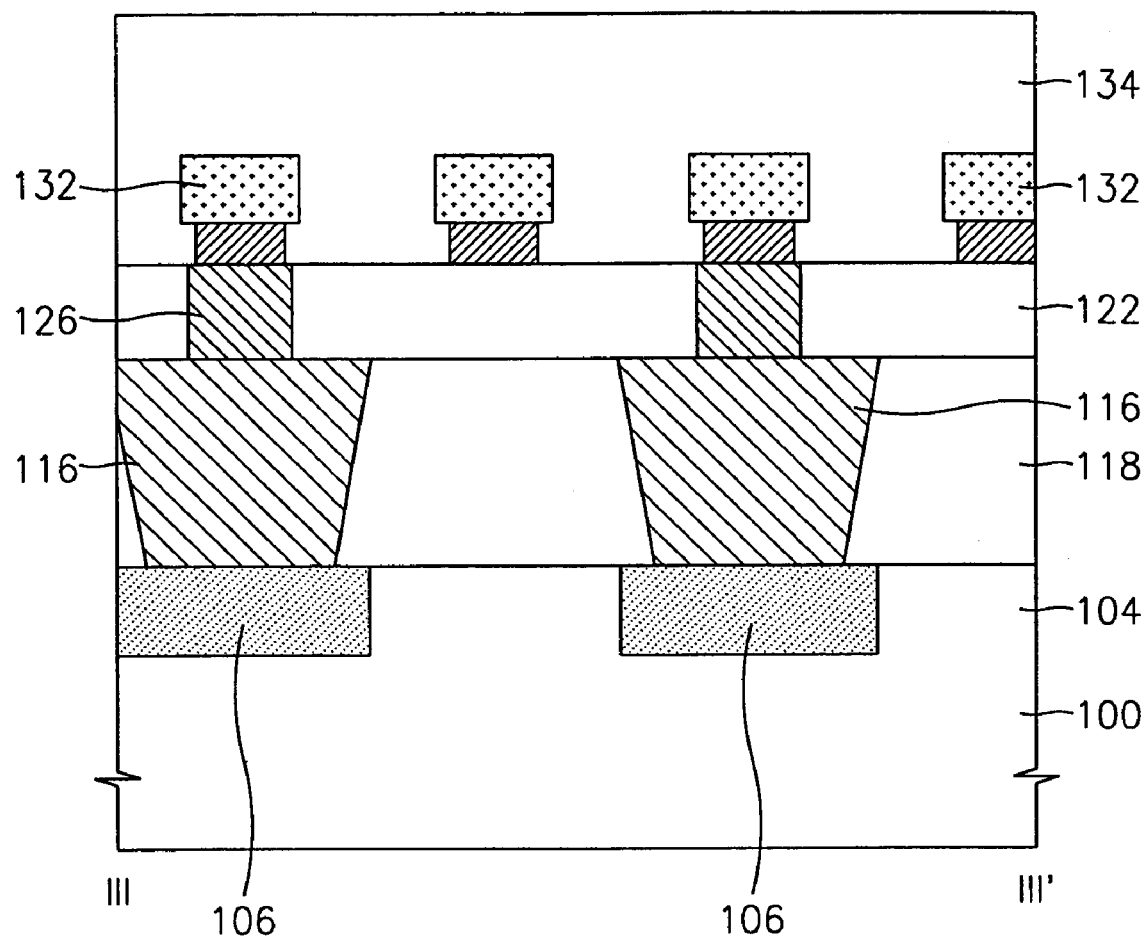
Figure 5A:
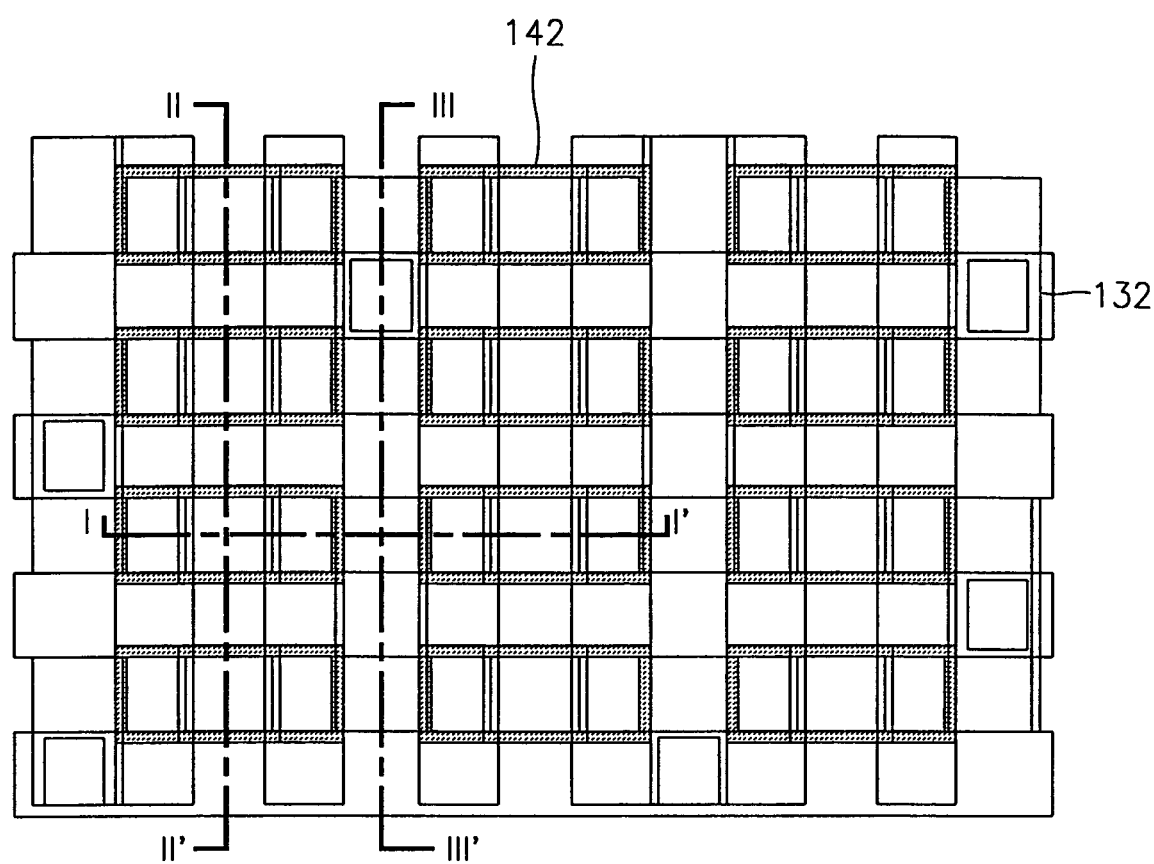
Figure 5B:
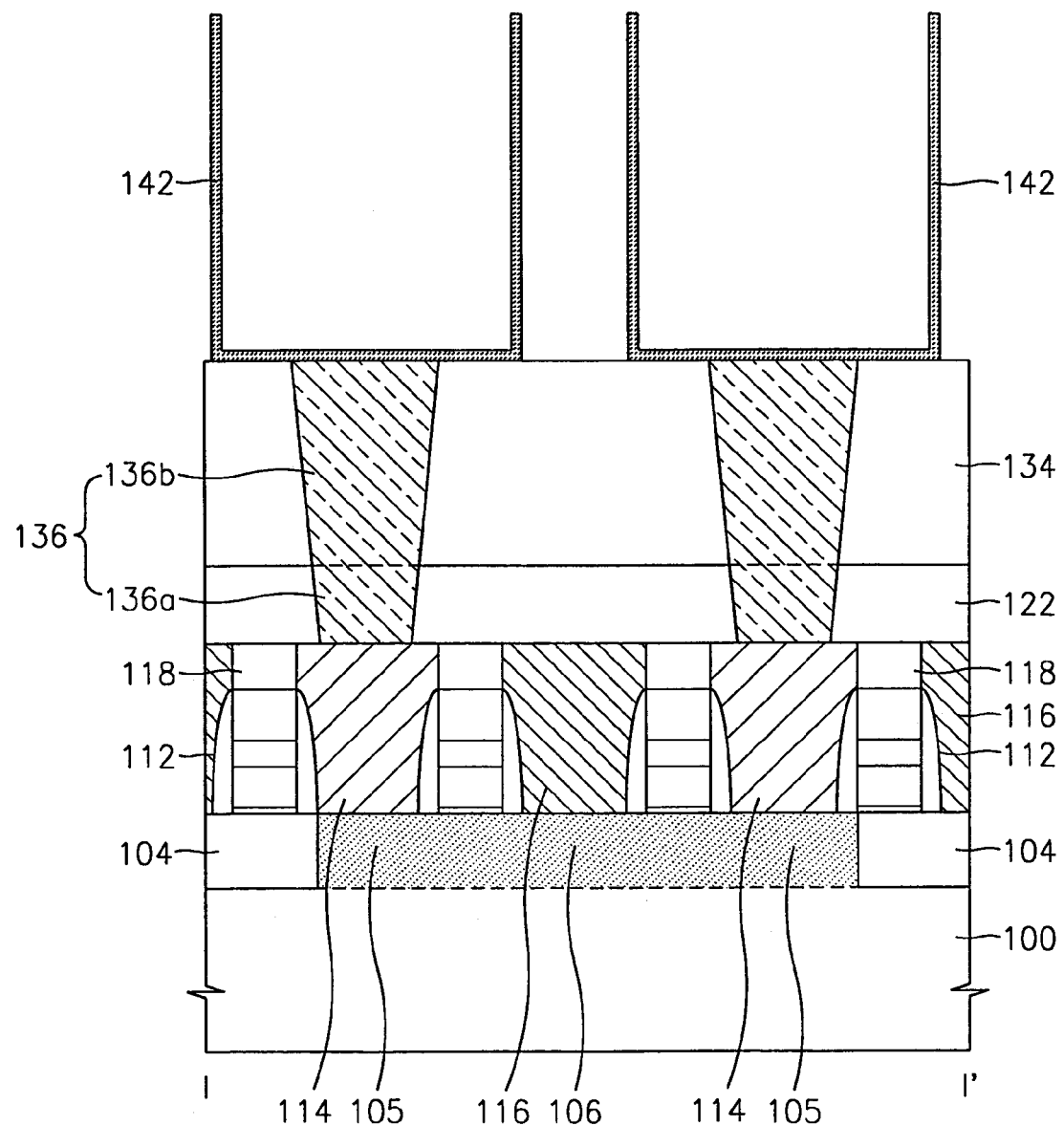
Figure 5C:
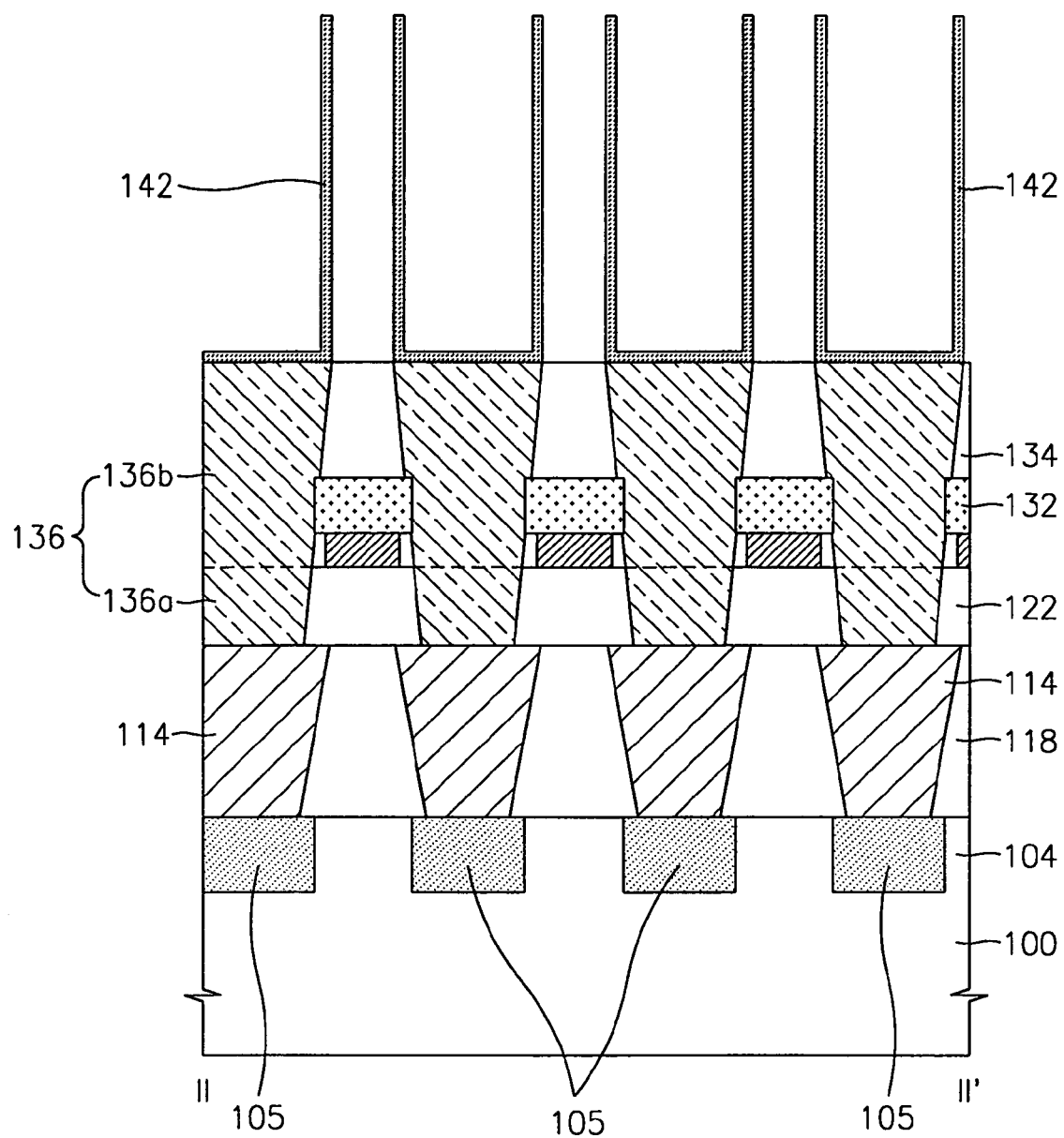
Figure 5D:
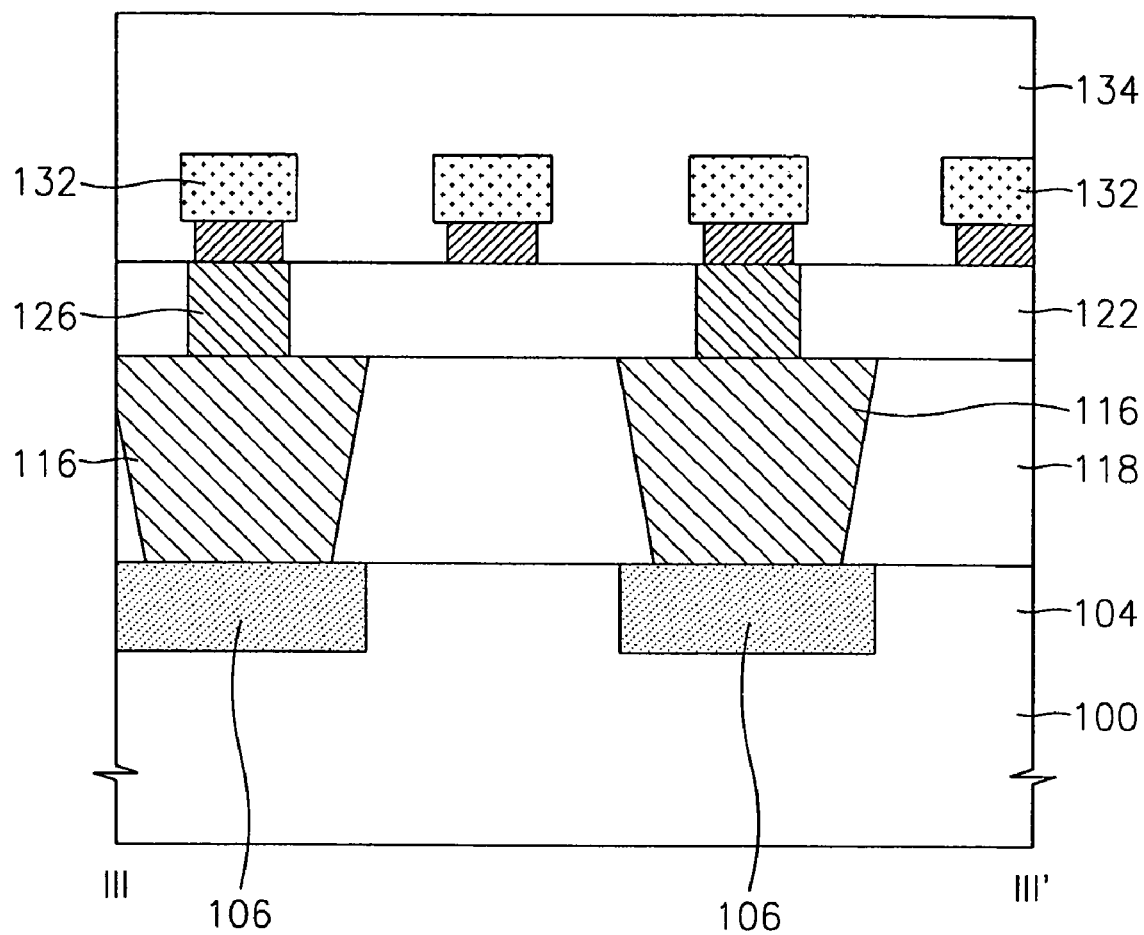

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the thickness of layers and regions may be exaggerated for clarity. The same reference numerals represent the same elements throughout the drawings.

FIGS. 6A through 9D are schematic views of a semiconductor memory device with a memory cell, which has the equivalent circuit structure shown in FIG. 1, explaining a method of manufacturing the same, according to an embodiment of the present invention. In detail, FIGS. 6A, 7A, 8A, and 9A are plan views of the semiconductor memory device and the other drawings are cross-sectional views thereof. In the plan views, some elements, e.g., an interlevel dielectric layer, are omitted for simplicity. Also, elements manufactured during a previous process are illustrated only with solid lines in each drawing.

Figure 6A:
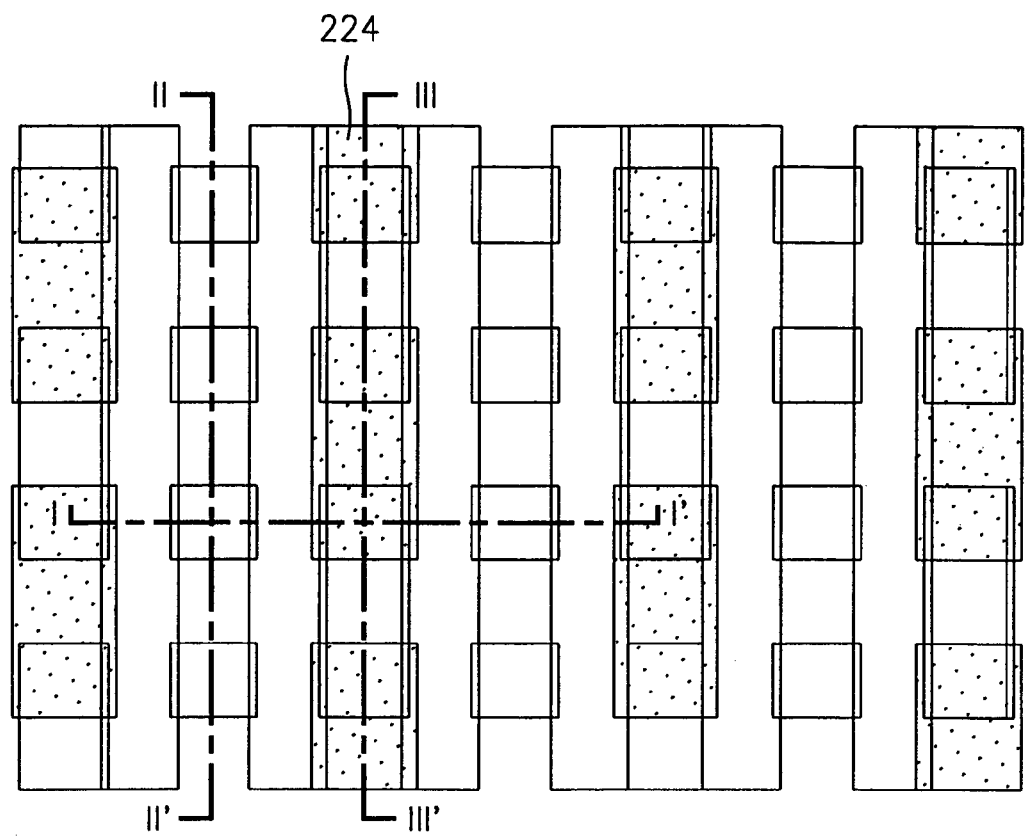
FIGS. 6A through 9D are plan views and cross-sectional views of a semiconductor memory device and a method of manufacturing the same, according to a preferred embodiment of the present invention.
Figure 6B:
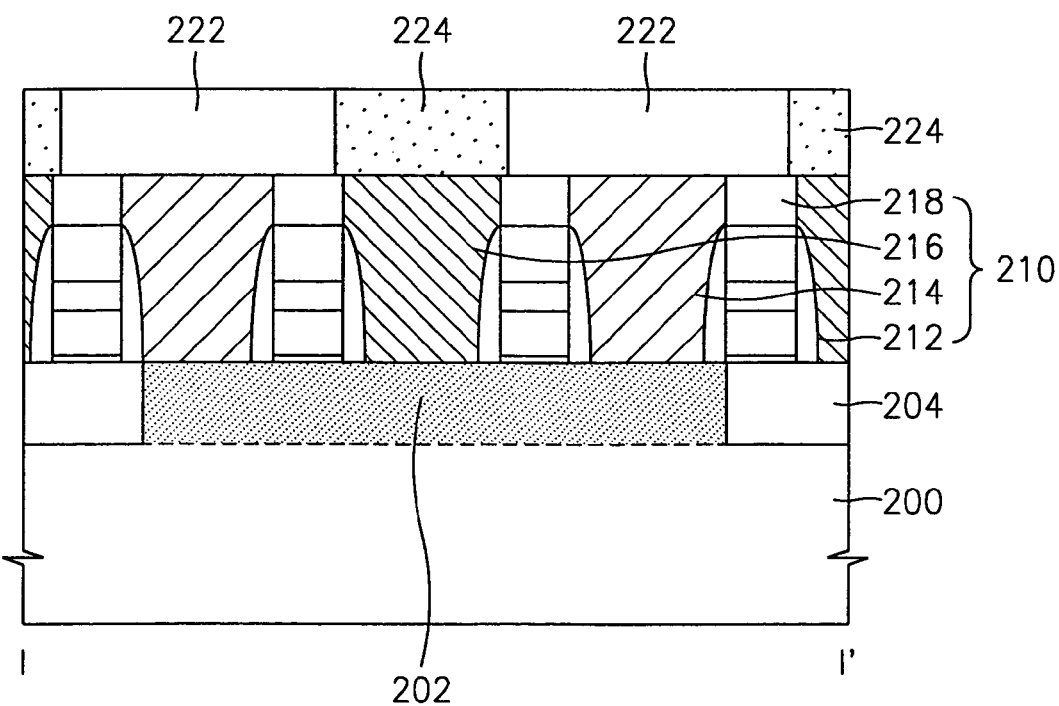
Figure 6C:
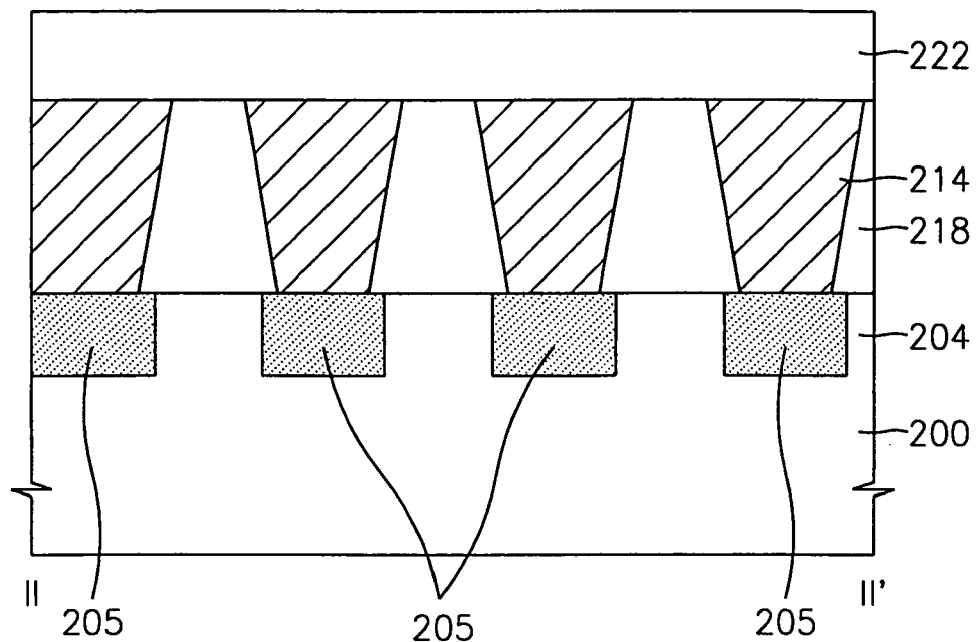
Figure 6D:
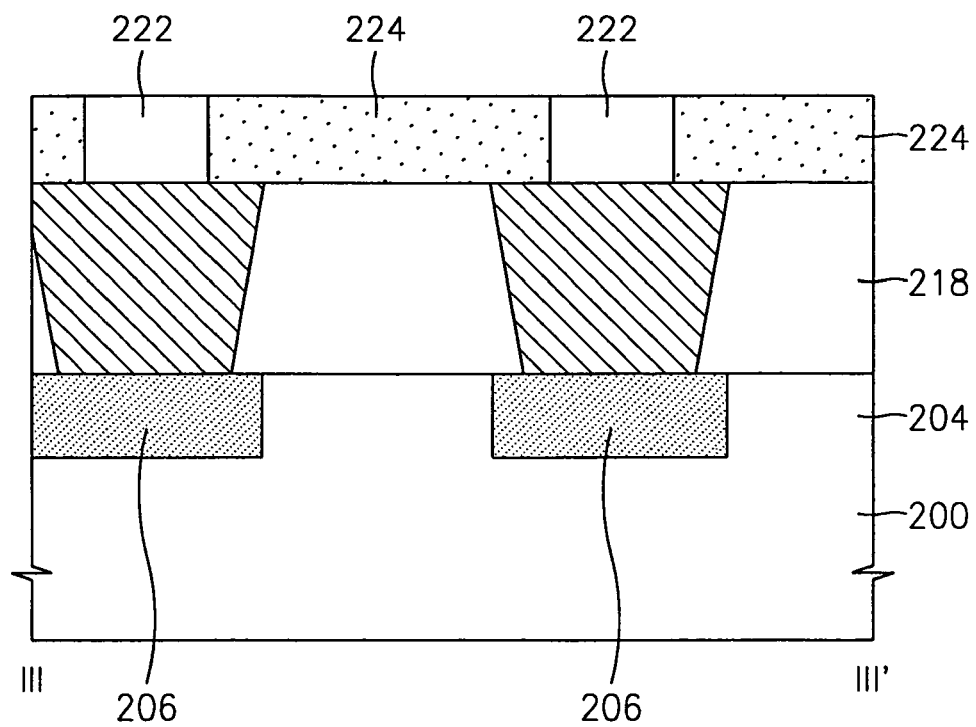

FIG. 6A is a plan view of a protective layer pattern 224 and FIGS. 6B through 6D are cross-sectional views of the resultant structure of FIG. 6A, taken along lines I–I', II–II', and III–III', respectively.

Referring to FIGS. 6A through 6D, an active area 202 with source/drain regions and an isolation region 204 surrounding the active area 202 are formed in a semiconductor substrate 200, and contact pad layers 210 are formed on the semiconductor substrate 200. The contact pad layers 210 include gate line structure 212, first contact pads 214, second contact pads 216, and first interlevel dielectric layer 218 covering the gate line structure 212 and the first and second contact pads 214 and 216. The semiconductor substrate 200 and the contact pad layers 210 may be fabricated using conventional processing techniques.

Referring to FIGS. 6A through 6D, a second interlevel dielectric layer 222 is then formed on the contact pad layers 210. The second interlevel dielectric layer 222 may be a silicon oxide layer. Then, the second interlevel dielectric layer 222 is patterned to define portions thereof on which a protective layer pattern 224 is to be formed. The patterning of the second interlevel dielectric layer 222 expose portions of the contact pad layers 210. Next, the portions on which the protective layer pattern 224 is to be formed are filled with a predetermined insulating material so as to obtain the protective layer pattern 224. Thus, the second interlevel dielectric layer 222 and the protective layer pattern 224 are additionally formed compared to the resultant structure shown in FIGS. 3A through 3D.

The protective layer pattern 224 prevents short circuit between the second contact pads 216 and storage node contact plugs 236 which will be explained later with reference to FIGS. 8A through 8D. For this reason, the protective layer pattern 224 covers at least portions of the second contact pads 216. More specifically, the protective layer pattern 224 is preferably formed in a straight line on the first contact pads 214 in the width direction. That is, even if the storage node contact plugs 236 are arranged on a plane in a zigzag pattern, the protective layer pattern 224 acts as a barrier that prevents short circuit between the storage node contact plugs 236 and the second contact pads 216.

FIG. 6A illustrates an example of a plan layout of the protective layer pattern 224. The layout of the protective layer pattern 224 is not, however, limited to the above-described embodiment. More specifically, the protective layer pattern 224 is formed to cover at least a portion of the second contact pads 216. Preferably, the protective layer pattern 224 covers substantially the entire portions of the second contact pads 216, except for portions connected to bit line contact plugs 226 which will be later described with reference to FIG. 8D.

Figure 8A:
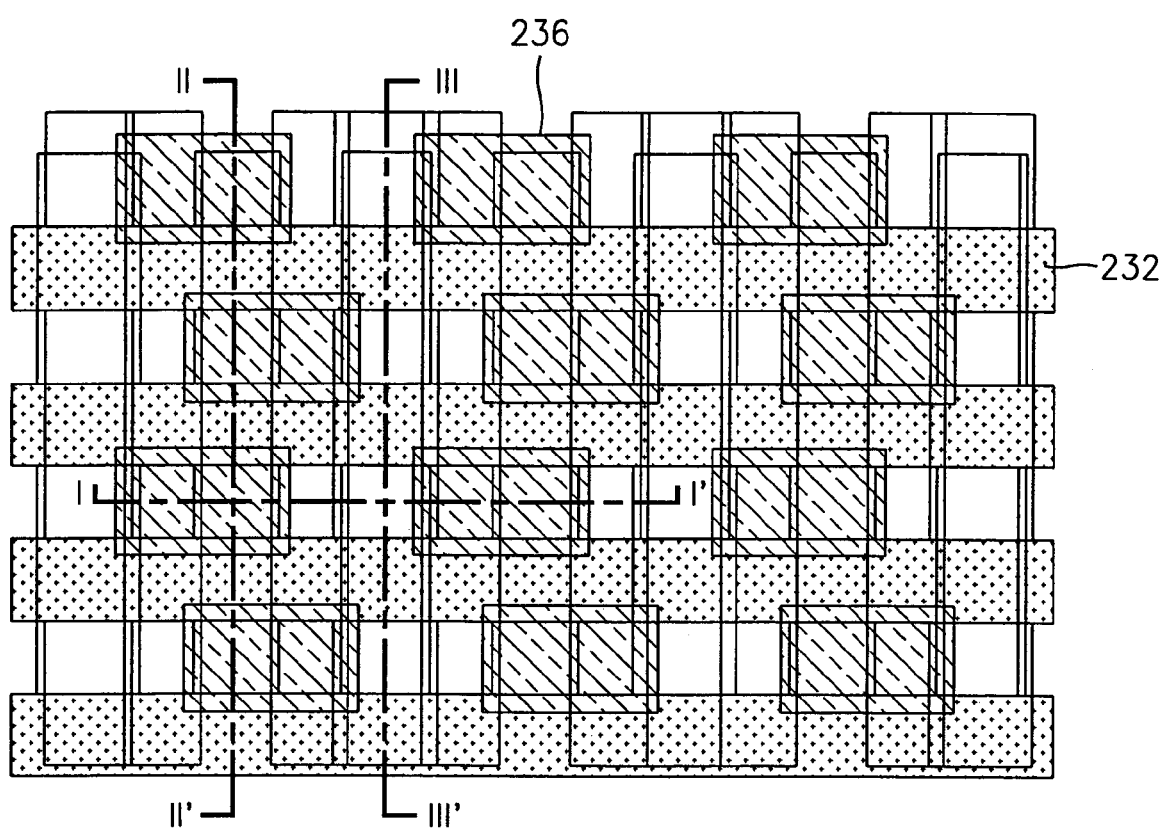
Figure 8B:
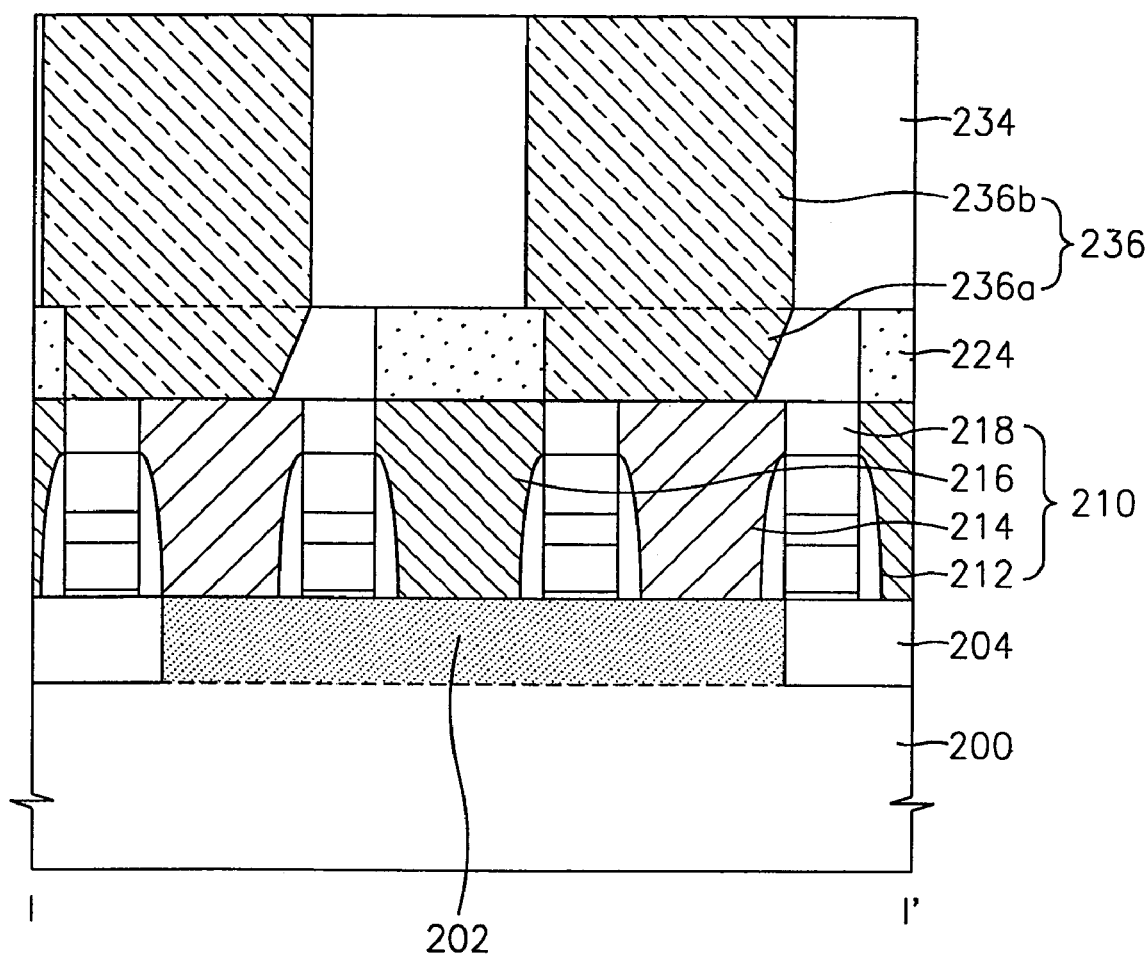

The protective layer pattern 224 is preferably formed of a material with a high etching selectivity against the second interlevel dielectric layer 222, more preferably, formed of a material with a high etching selectivity against a third interlevel dielectric layer 234 shown in FIG. 8B. For instance, the protective layer pattern 224 is formed of an insulating material such as a silicon nitride.

Figure 7A:
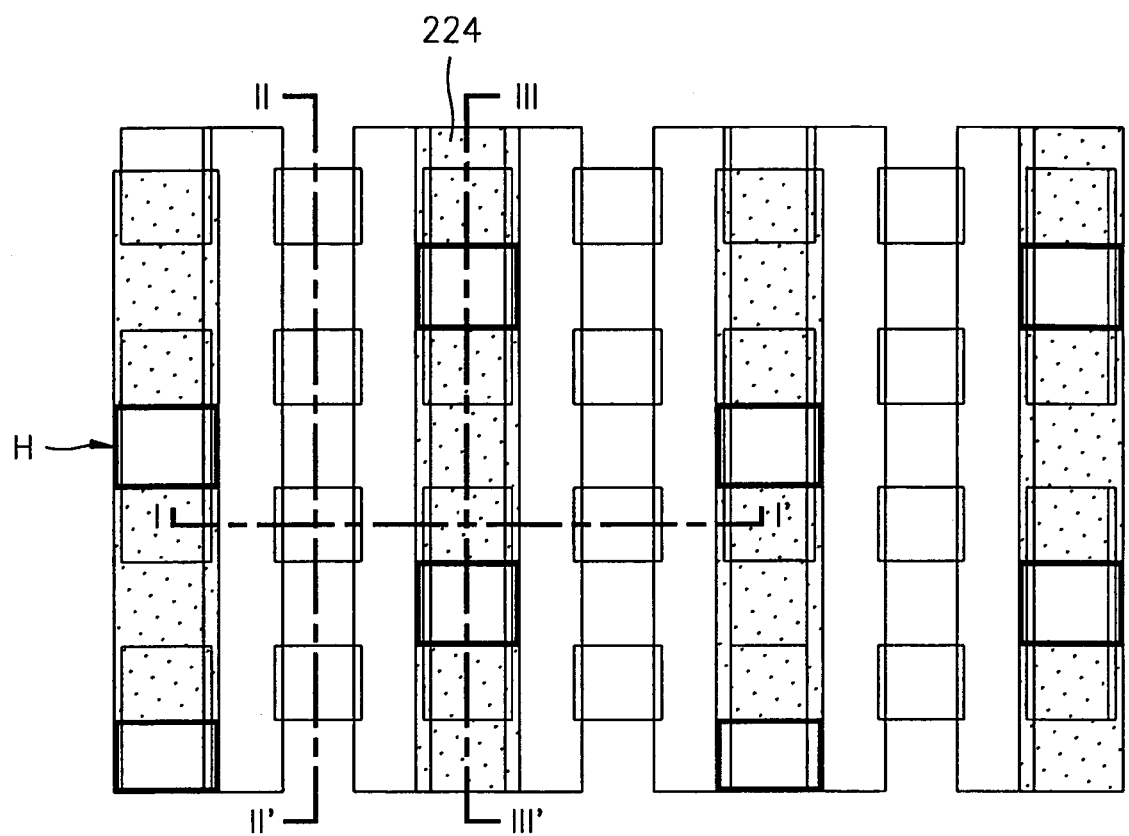
Figure 7B:
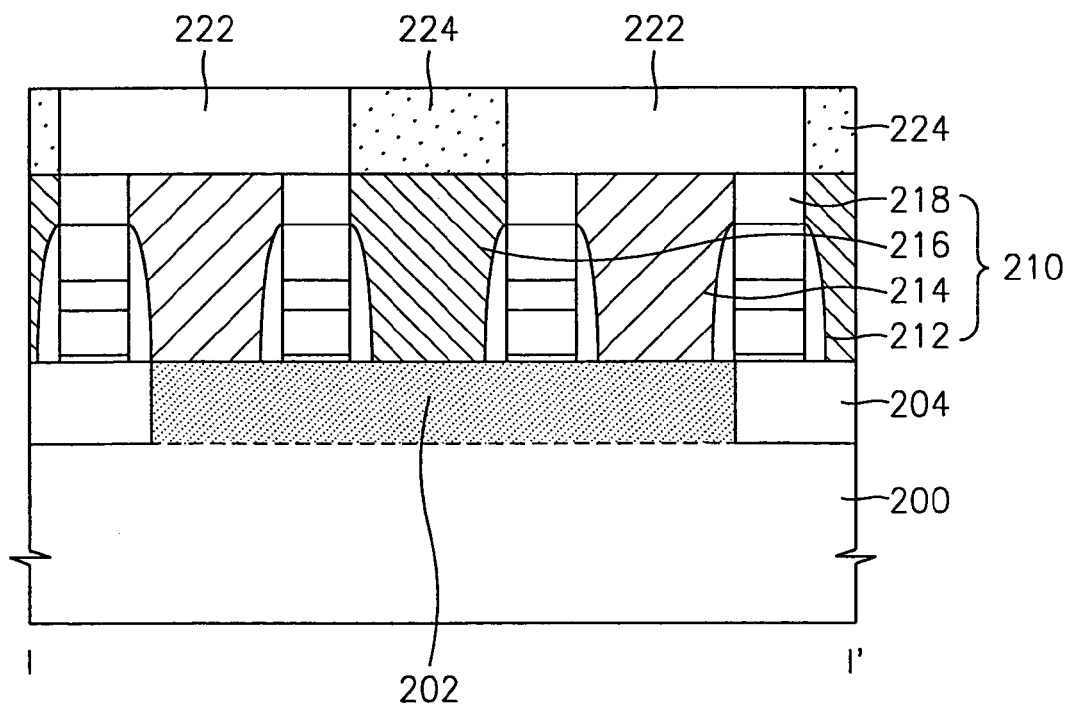
Figure 7C:
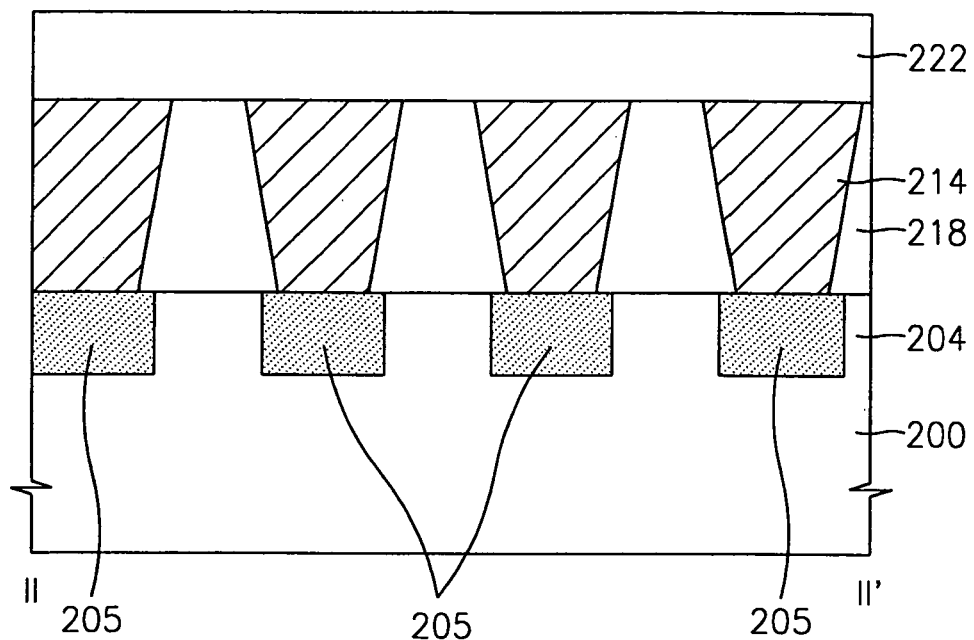
Figure 7D:
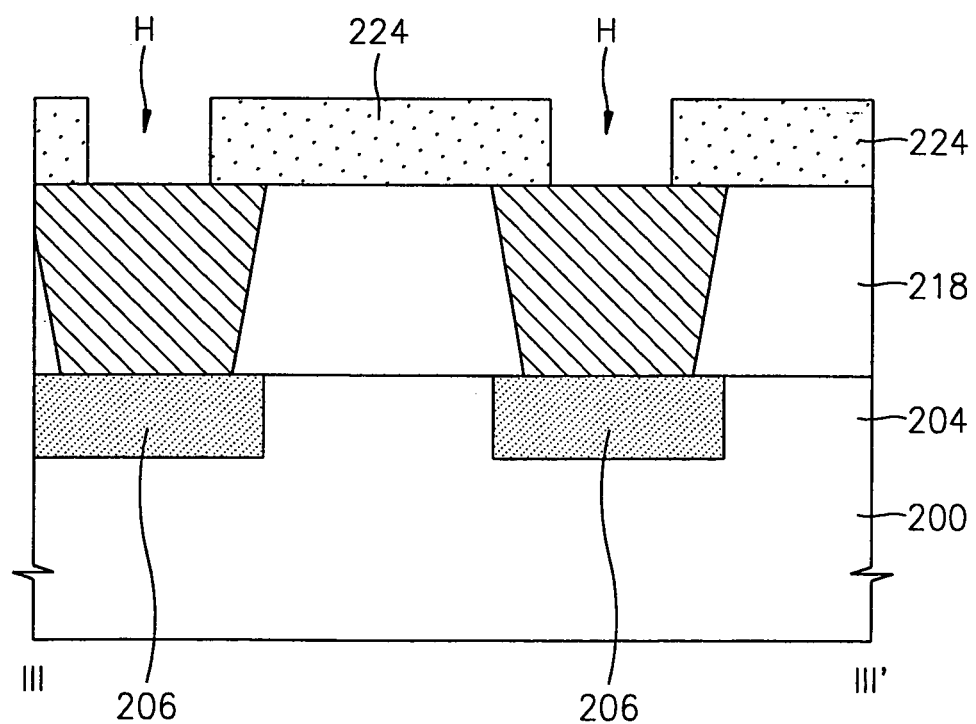

FIG. 7A is a plan view of first contact holes H in the second interlevel dielectric layer 222. FIGS. 7B through 7D are cross-sectional views of the structure of FIG. 7A, taken along lines I–I', II–II', and III–III', respectively.

Referring to FIGS. 7A through 7D, the second interlevel dielectric layer 222 is etched to form the first contact holes H in which the bit line contact plugs 226 are to be formed. The second interlevel dielectric layer 222 may be etched using a conventional photolithographic process.

Referring to a plan arrangement of the protective layer pattern 224 of FIG. 6A, the first contact holes H can be formed by etching the second interlevel dielectric layer 222. That is, the shapes of the first contact holes H may vary depending on the plan arrangement and shape of the protective layer pattern 224. For instance, both the second interlevel dielectric layer 222 and a portion of the protective layer pattern 224 may be etched to form the first contact holes H. Otherwise, only the protective layer pattern 224 may be etched to form the first contact holes H.

Figure 8C:
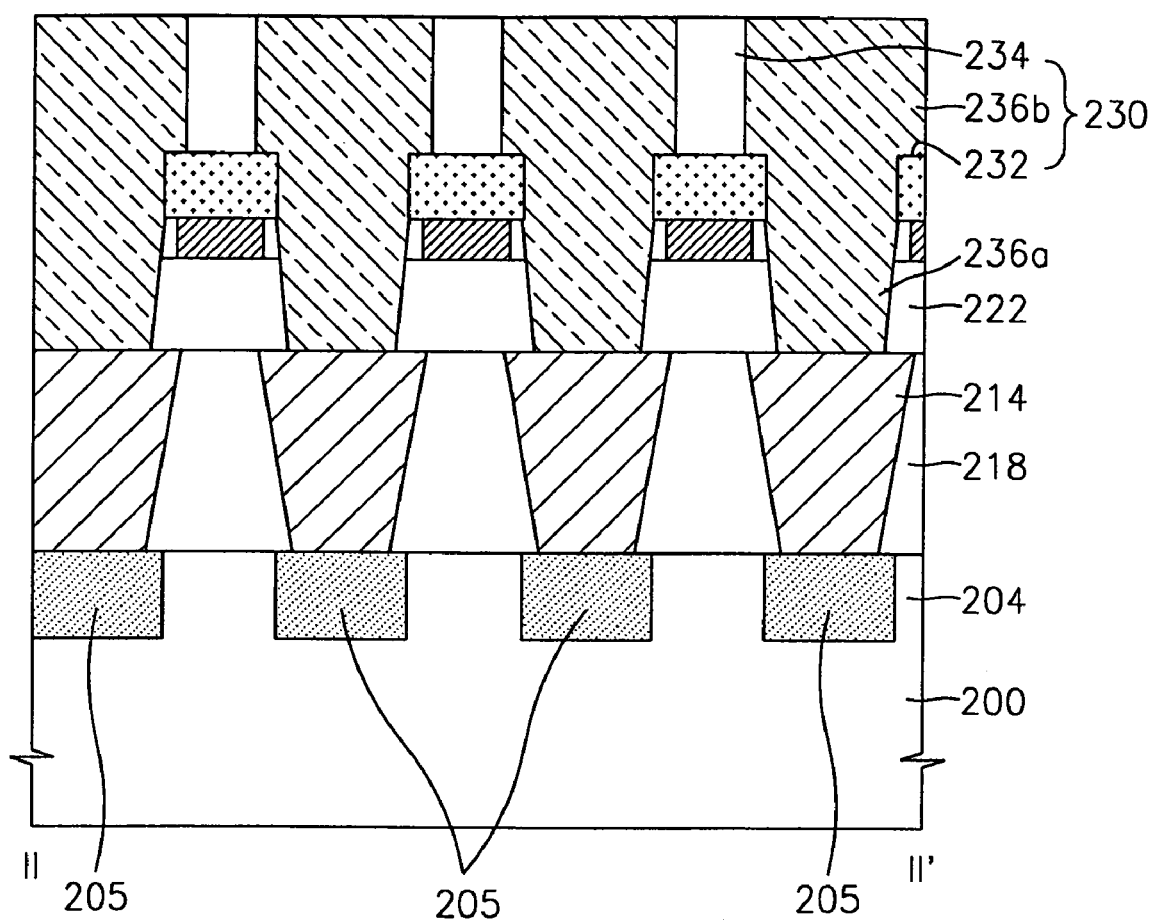
Figure 8D:
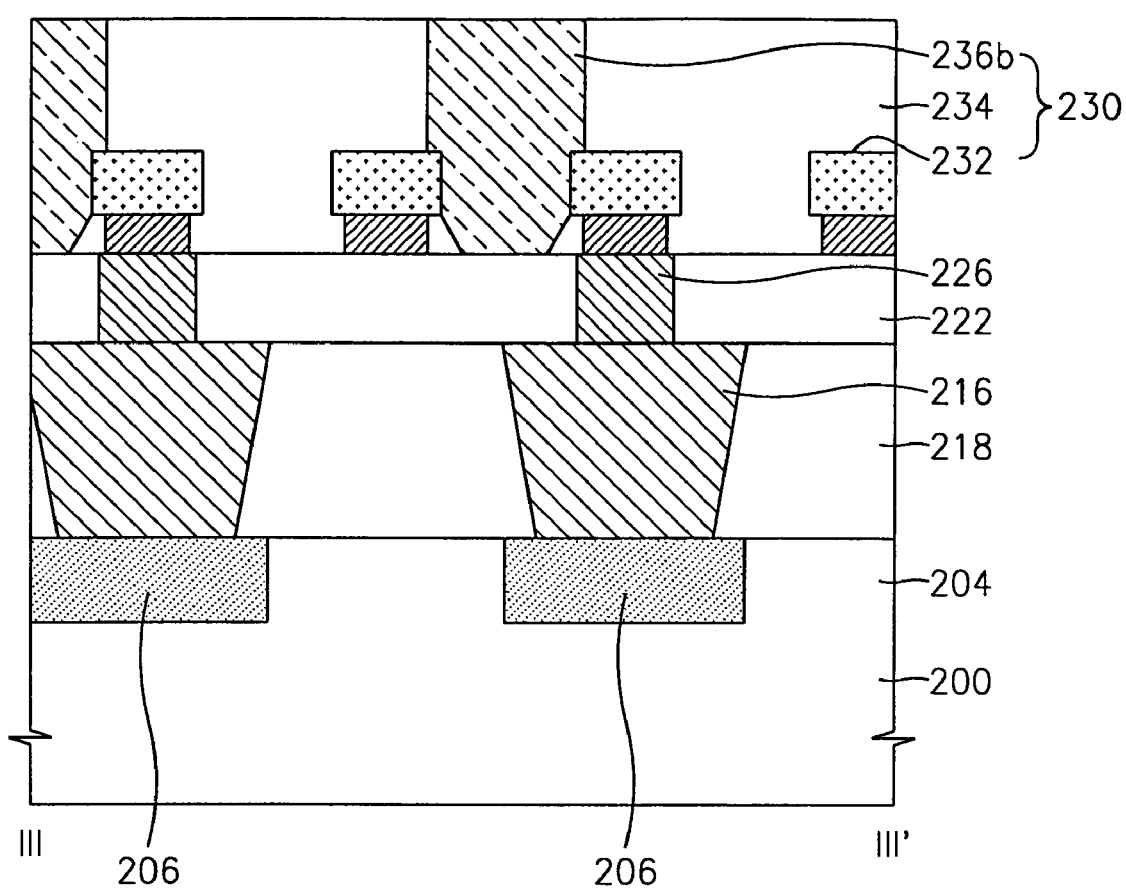

FIG. 8A shows a plan arrangement of the structure stacked with the bit line contact plugs 226, the bit line structure 232, and the storage node contact plugs 236. FIGS. 8B through 8D are cross-sectional views of the structure of FIG. 8A, taken along lines I–I', II–II', and III–III', respectively.

The structure shown in FIGS. 8A through 8D may be fabricated using a conventional method of fabricating semiconductor memory devices. However, compared to the conventional method, a photo mask pattern used to form the storage node contact plugs 236 and the shape and plan arrangement of capacitor lower electrodes 242 formed on the storage node contact plugs 236 may be different from those of the capacitor lower electrodes 142.

More specifically, the insides of the first contact holes H and upper portions of the second interlevel dielectric layer 222 and the protective layer pattern 224 are coated with an insulating layer so as to form a conductive layer and a hard mask layer thereon. The conductive layer may be formed of doped polysilicon or a metal such tungsten and the insulating layer may be formed of silicon nitride. Next, the insulating layer and the conductive layer are patterned to form the bit line structure 232.

Thereafter, the third interlevel dielectric layer 234 is deposited on the resultant structure and planarized. The upper level of the third interlevel dielectric layer 234 is preferably higher than that of the bit line structure 232. The third interlevel dielectric layer 234 is patterned to form second contact holes (not shown).

According to the embodiment described above, the pattern of a photo mask used to form the second contact holes is different from a mask pattern used in the conventional method. For instance, the photo mask according to this embodiment may be larger than the conventional mask pattern in the width direction, i.e., in the direction of the bit line structure 232, and be deposited in a zigzag pattern in the direction of the gate line structure 212.

After formation of a photoresist pattern using the photo mask pattern, the second and third interlevel dielectric layer 222 and 234 are etched using the photoresist pattern as an etch mask. An etchant having a high etching selectivity with respect to the second and third interlevel dielectric layer 222 and 234 but having a low etching selectivity with respect to the mask layer and the protective layer pattern 224 on the bit line structure 232, is preferably used as in a self aligned contact (SAC) method. For instance, an etchant that reacts with a silicon oxide but hardly reacts with a silicon nitride may be used.

An upper portion of the third interlevel dielectric layer 234 is defined by etching of the second and third interlevel dielectric layer 222 and 234 using the photoresist pattern as an etch mask. When the third interlevel dielectric layer 234 is etched to a predetermined depth, the bit line structure 232 is exposed but it is not etched owing to the mask layer formed on the bit line structure 232. As the etching process continues, the second interlevel dielectric layer 222 and the protective layer pattern 224 are exposed, and then, only the second interlevel dielectric layer 222 is etched. The protective layer pattern 224 is formed of a material having a high etching selectivity against the second and third interlevel dielectric layers 222 and 234 and thus is hardly etched. Consequently, the second contact holes are formed and the first contact pads 214 are exposed through the second contact holes.

According to an embodiment of the present invention, the mouths of the second contact holes are larger than those of the second contact holes in the conventional semiconductor memory device. However, even when the second and third interlevel dielectric layers 222 and 234 are etched by the same amount or size as in the conventional method, the second contact pads 216 may not be exposed through the mouths of the second contact holes. This is because, during the etching, regions around the second contact pads 216 can be protected by the protective layer pattern 224. As a result, the second contact pads 216 may not be exposed by the second contact holes.

Accordingly, since the second contact pads 216 are not exposed by the second contact holes, it is possible to prevent connection and short circuit of the storage node contact plugs 236 and the second contact pads 216. Further, the storage node contact plugs 236 can be formed to be larger than in a conventional semiconductor memory device and be arranged on a plane in a zigzag pattern or fashion.

Thereafter, the second contact holes are filled with a conductive material and the conductive material is etched using dry etch back or chemical mechanical polishing (CMP), thereby obtaining the storage node contact plugs 236. In this disclosure, for convenience a portion of the storage node contact plug 236 covered by the second interlevel dielectric layer 222 is called a lower storage node contact plug 236a and the other portion thereof covered by the third interlevel dielectric layer 234 is called an upper storage node contact plug 236b (see FIG. 8B).

According to an embodiment of the present invention, the bit line contact plug layer 220 is formed on the contact pad layer 210 and include the bit line contact plug 226, the protective layer pattern 224, the lower storage node contact plug 326a, and the second interlevel dielectric layer 222. Also, a storage node contact plug layer 230 is formed on the bit line contact plug layer 220 and comprised of the upper storage node contact plug 326b, the bit line structure 232, and the third interlevel dielectric layer 234.

Figure 9A:
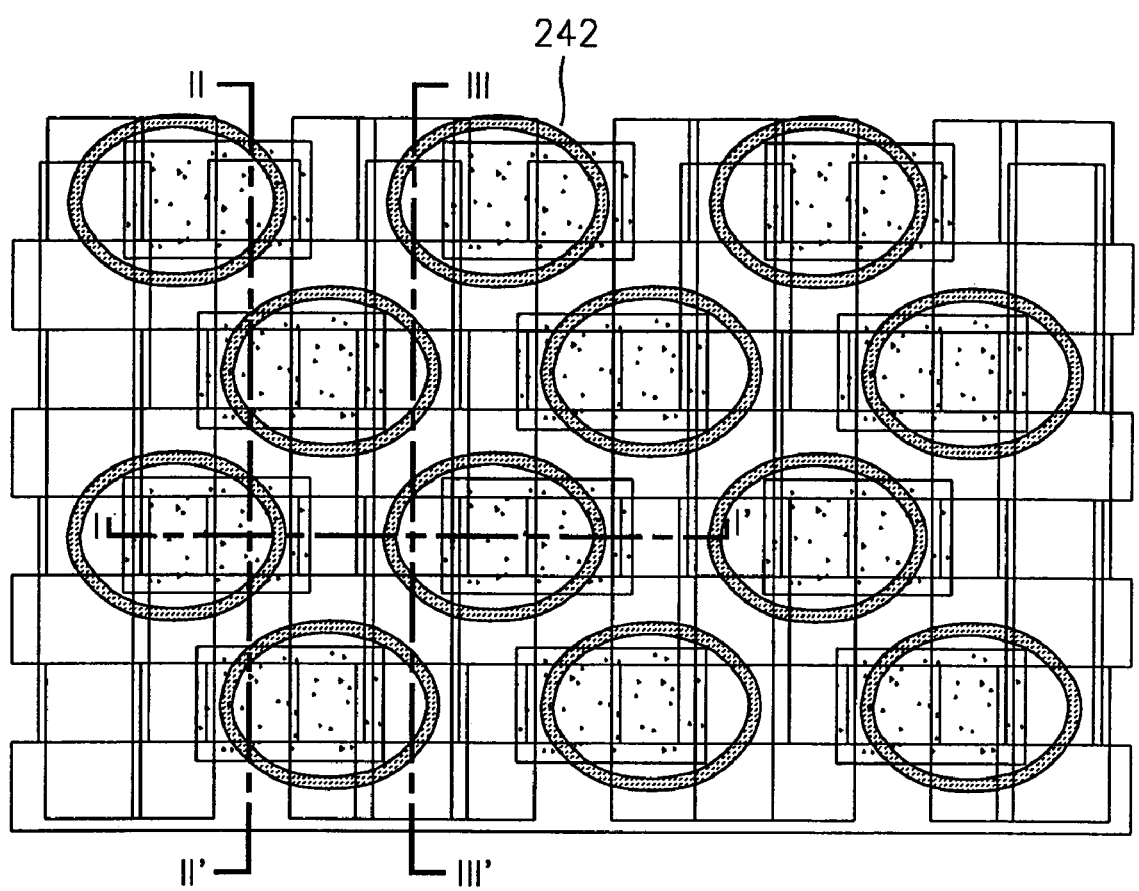
Figure 9B:
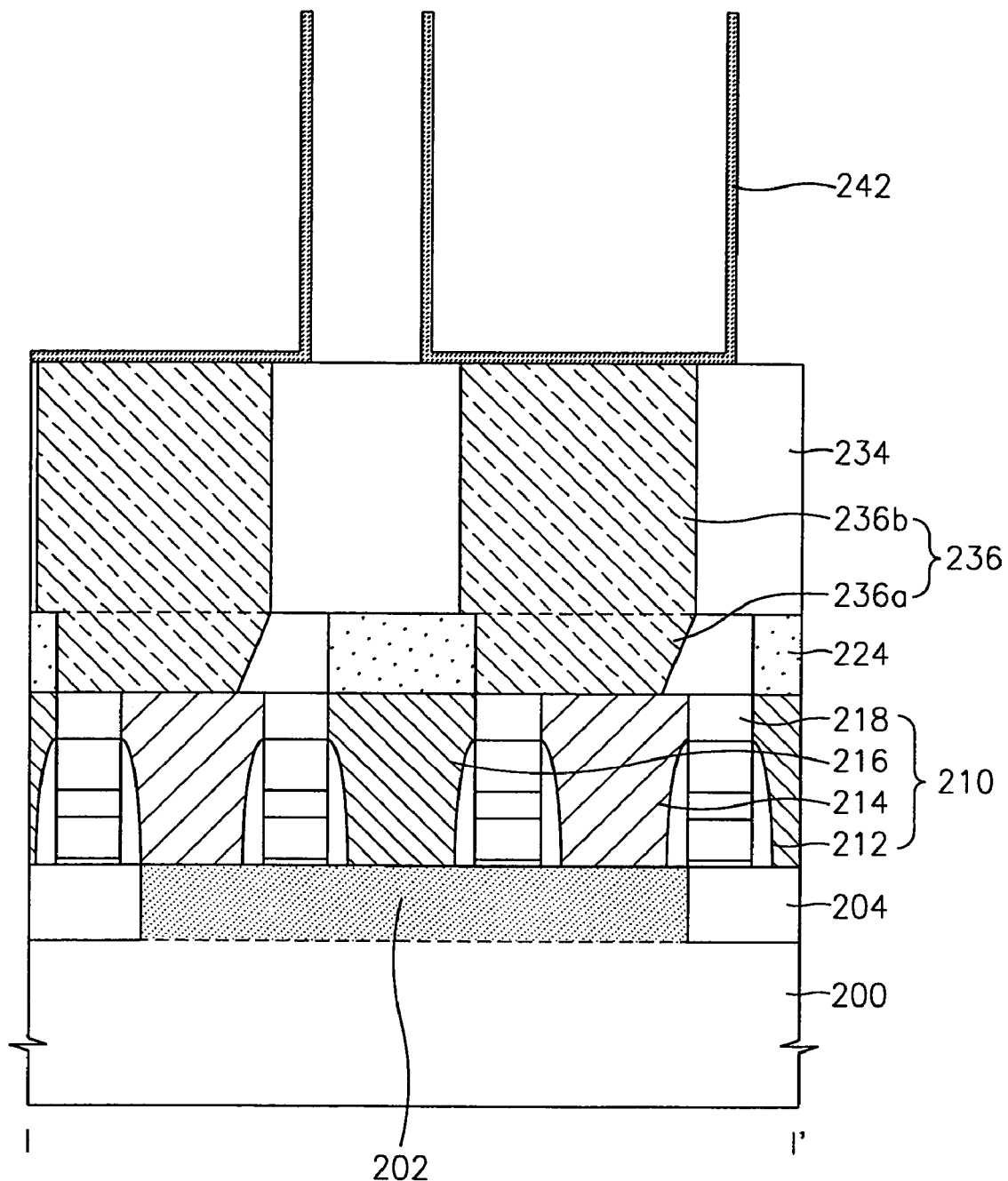
Figure 9C:
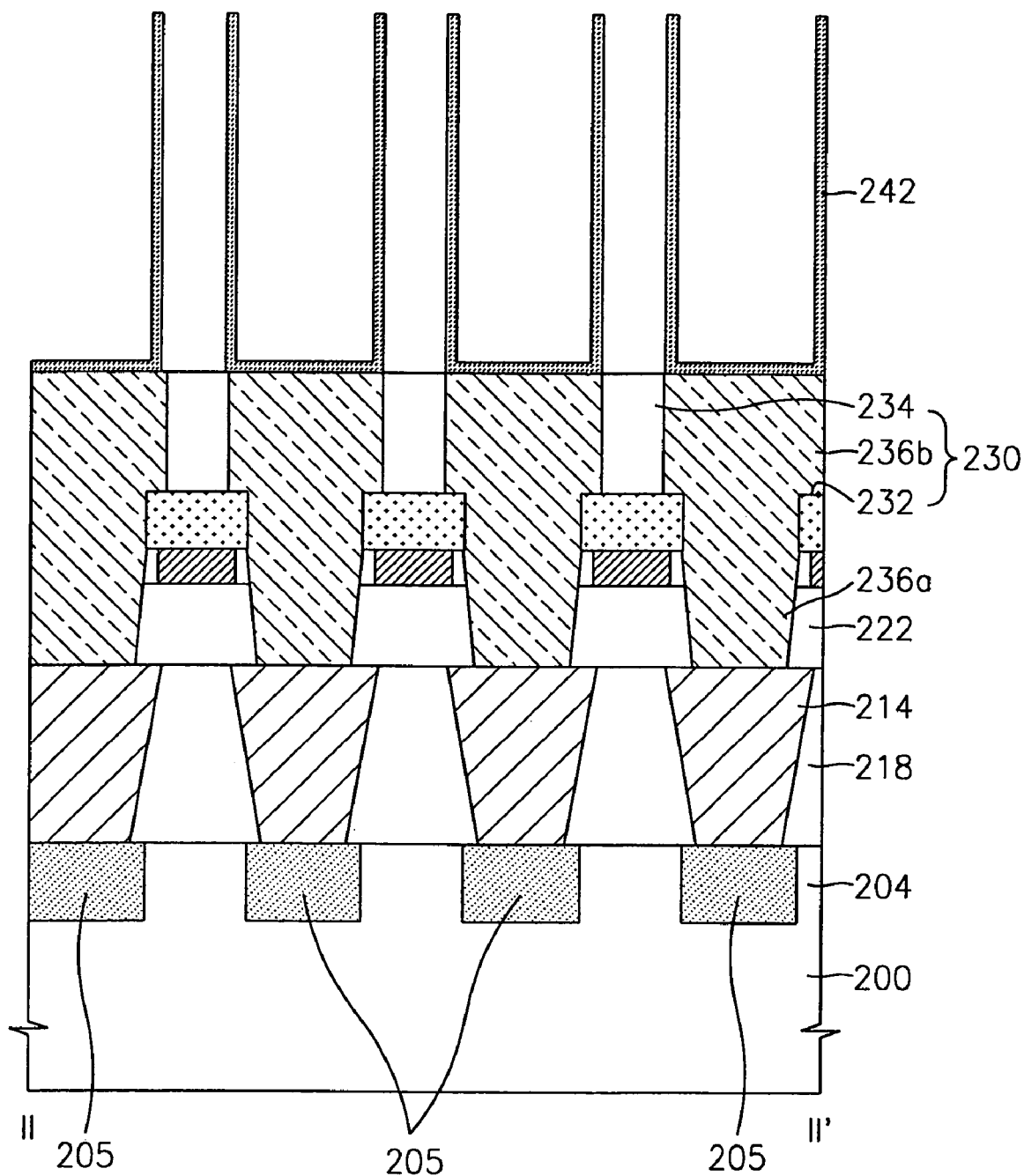
Figure 9D:
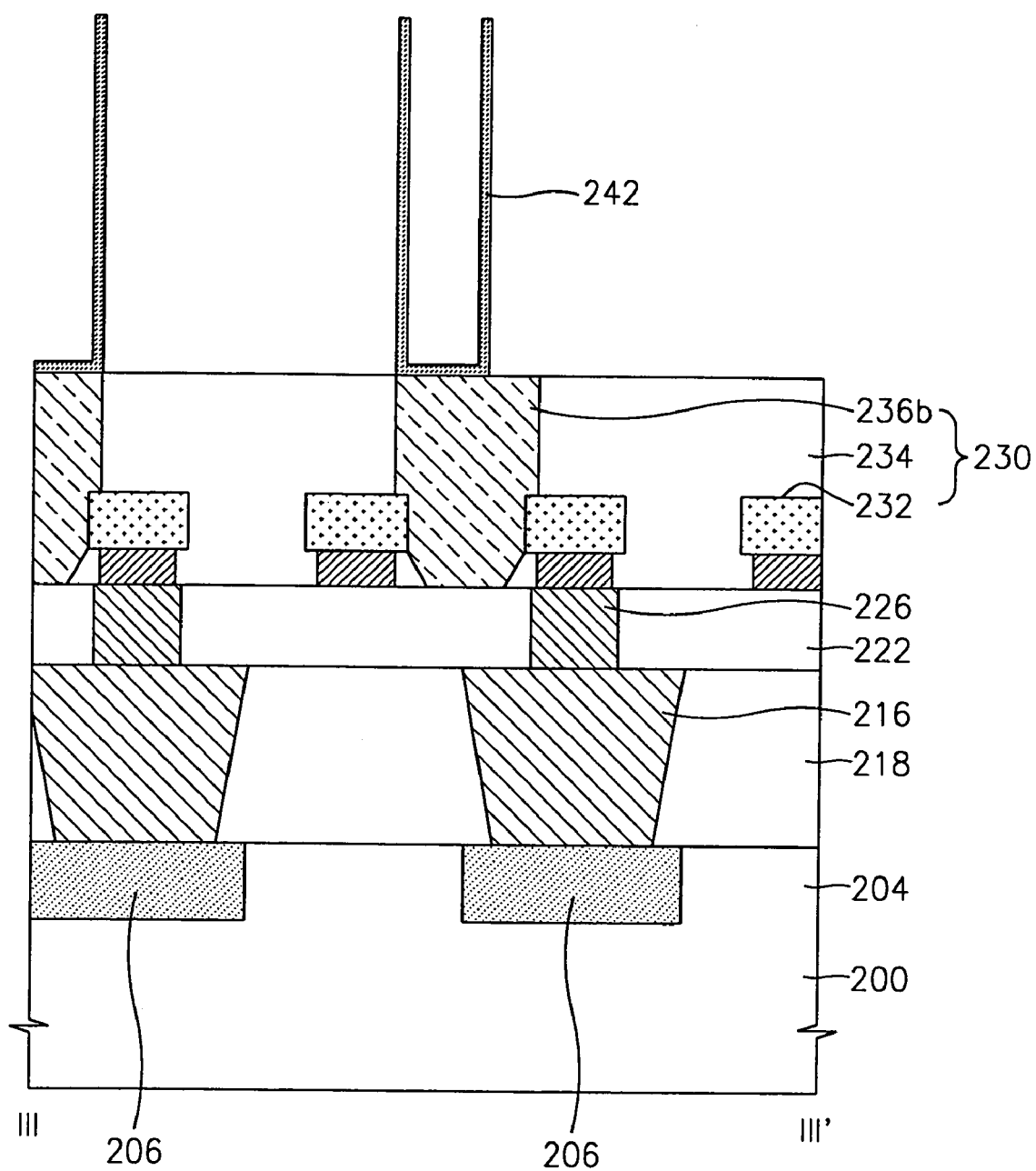

Next, a process of forming a capacitor is performed. FIGS. 9A through 9D illustrate resultant structures on which the cylinder type capacitor lower electrode 242 is formed. Likewise, FIG. 9A illustrates a plan arrangement of the capacitor lower electrode 242 and FIGS. 9B through 9D are cross-sectional views of the structure of FIG. 9A, taken along lines I–I', II–II', and III–III', respectively.

The cylinder type capacitor lower electrode 242 may be fabricated using a conventional formation method, and therefore, a detailed description thereof will be omitted. However, unlike in the conventional method, the capacitor lower electrodes 242 are arranged in a zigzag pattern rather than straight, since it is possible to make the storage node contact plugs 236 to a large degree, in a zigzag pattern or fashion.

Also, the arrangement of the capacitor lower electrodes 242, which is in the zigzag pattern makes it possible to form them to diamond, oval, or rectangle shapes. If the capacitor lower electrodes 242 are formed to rectangle shapes, their lengths and widths could be almost the same or similar to each other. Accordingly, the capacitor lower electrodes 242 hardly fall down, i.e., they can support themselves, whereas the widths of conventional capacitor lower electrodes are too small to support themselves.

Assume a DRAM having the design rule of 0.10 µm includes the capacitor lower electrodes 242 having rectangular (or oval) planar shapes. When the DRAM is fabricated using a fabrication method according to the present invention, the dimensions of the rectangle in the length direction (or the length of the oval in the direction of its long axis), in the width direction (or the length of the oval in the direction of its short axis), and in the height direction are roughly 250 nm, 200 nm, and 1500, respectively. That is, the ratio of its height to its length is about 5 and the ratio of it height to its width is about 8. Compared to the conventional capacitor lower electrode 142, the ratio of the height to the width is reduced to about ⅔. Therefore, it is possible to remarkably reduce possibilities that the capacitor lower electrodes 242 fall down and causes malfunctions of the semiconductor memory device.

Although a reduction in the length of the capacitor lower electrode 242 in the length direction reduces the effective area to about 10%, it is possible to increase the effective area by increasing the height of the capacitor lower electrode 242. Assuming that a ratio of the width (the length of the short axis of the oval) to the height of the capacitor lower electrode 242 is the same as a ratio of the width to the height of a conventional capacitor lower electrode, it is possible to increase the height of the capacitor lower electrode 242 by about 30%. As a result, the total effective area of the capacitor according to the present invention increases to about 20% and its capacitance increases to about 20%.

Also, according to the present invention, although the design rule of a semiconductor memory device is 0.10 µm or less, the capacitor lower electrode 242 can be fabricated by patterning a mold oxide layer using KrF equipment and a KrF photoresist, not ArF equipment and an ArF photoresist. Thus, it is possible to remarkably reduce manufacturing costs and secure a sufficient process margin.

According to the present invention, it is easy to fabricate a semiconductor memory device with a capacitor in a zigzag pattern or fashion even using a conventional memory cell in which an active area is formed straight. Therefore, it is possible to prevent malfunctions of the semiconductor memory device caused by collapsing of the capacitor and further fabricate the capacitor with sufficient capacitance.

Further, although the design rule of a semiconductor memory device is 0.10 µm or less, it is possible to perform a photolithographic process with Krf equipment and the KrF photoresist. Accordingly, it is possible to reduce manufacturing costs and secure a sufficient process margin.

While this invention has been particularly shown and described with reference to certain embodiments, it will be understood by those skilled in the art that various changes in form and details may be made therein without departing from the spirit and scope of the invention as defined by the appended claims.

What is claimed is:

1. A semiconductor memory device with a capacitor on a bit line (COB) cell structure, comprising:
   a semiconductor substrate including an isolation region that defines an active area with a plurality of source/drain regions;
   a contact pad layer formed on the semiconductor substrate, said contact pad layer including gate line structures, first contact pads connected to parts of the source/drain regions, second contact pads connected to the other source/drain regions, and a first interlevel dielectric layer formed to cover the gate line structures and formed to laterally surround the first and second contact pads;
   a bit line contact plug layer on the contact pad layer, said bit line contact plug layer including lower storage node contact plugs connected to the first contact pads, bit line contact plugs connected to the second contact pads, a protective layer pattern that covers at least a portion of the second contact pads to prevent the second contact pads from contacting the lower storage node contact plugs, and a second interlevel dielectric layer formed to laterally surround the lower storage node contact plugs, the bit line contact plugs, and the protective layer pattern; and a bit line layer formed on the bit line contact plug layer, said bit line layer including upper storage node contact plugs connected to the lower storage node contact plugs, bit line structures connected to the bit line contact plugs, and a third interlevel dielectric layer formed to laterally surround the upper storage node contact plugs and formed to laterally surround and cover the bit line structures.

2. The semiconductor memory device of claim 1, wherein the protective layer pattern is formed of a material having a high etching selectivity with respect to the second interlevel dielectric layer.

3. The semiconductor memory device of claim 2, wherein the second interlevel dielectric layer is formed of a silicon oxide and the protective layer pattern is formed of silicon nitride.

4. The semiconductor memory device of claim 1, further comprising a capacitor formed on the bit line layer and connected to the upper storage node contact plugs.

5. A semiconductor memory device of a COB cell structure in which a plurality of source/drain regions are arranged in a substantially straight line in the length and width directions, the semiconductor memory device comprising:

a semiconductor substrate having a plurality of source/drain regions defined by an isolation region;

a contact pad layer on the semiconductor substrate, the contact pad layer including gate line structures, first contact pads connected to parts of the source/drain regions, second contact pads connected to the other source/drain regions, and a first interlevel dielectric layer formed to cover the gate line structures and formed to laterally surround the first and second contact pads;

a bit line contact plug layer on the contact pad layer, the bit line contact plug layer including lower storage node contact plugs connected to the first contact pads, bit line contact plugs connected to the first contact pads, a protective layer pattern formed on at least a portion of the second contact pads to prevent the second contact pads from contacting the lower storage node contact plugs, and a second interlevel dielectric layer formed to laterally surround the lower storage node contact plugs, the bit line contact plugs, and the protective layer pattern; and a bit line layer on the bit line contact plug layer, said bit line layer including upper storage node contact plugs connected to the lower storage node contact plugs and arranged in a zigzag pattern, bit line structures connected to the bit line contact plugs, and a third interlevel dielectric layer formed to laterally surround the upper storage node contact plugs and formed to laterally surround and cover the bit line structures.

6. The semiconductor memory device of claim 5, wherein the protective layer pattern is formed of a material having a high etching selectivity with respect to the second interlevel dielectric layer.

7. The semiconductor memory device of claim 6, wherein the second interlevel dielectric layer is formed of silicon oxide and the protective layer pattern is formed of silicon nitride.

8. The semiconductor memory device of claim 5, further comprising a capacitor on the bit line layer and connected to the upper storage node contact plugs.

9. The semiconductor memory device of claim 8, wherein lower electrodes of the capacitor are arranged in a zigzag pattern.

10. The semiconductor memory device of claim 9, wherein lower electrodes of the capacitor are cylinder shaped.

* * * * *